United States Patent
Lu et al.

(10) Patent No.: US 10,079,246 B2
(45) Date of Patent: Sep. 18, 2018

(54) APPARATUSES AND METHODS FOR FORMING MULTIPLE DECKS OF MEMORY CELLS

(71) Applicant: Micron Technology, Inc., Boise, ID (US)

(72) Inventors: Zhenyu Lu, Boise, ID (US); Roger W. Lindsay, Boise, ID (US); Akira Goda, Boise, ID (US); John Hopkins, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/849,242

(22) Filed: Dec. 20, 2017

(65) Prior Publication Data

US 2018/0138196 A1     May 17, 2018

Related U.S. Application Data

(62) Division of application No. 15/174,478, filed on Jun. 6, 2016, now Pat. No. 9,853,046, which is a division
(Continued)

(51) Int. Cl.
| | |
|---|---|
| *H01L 21/336* | (2006.01) |
| *H01L 27/11582* | (2017.01) |
| *G11C 16/04* | (2006.01) |
| *G11C 16/14* | (2006.01) |
| *H01L 27/11573* | (2017.01) |
| *G11C 16/26* | (2006.01) |
| *H01L 27/11529* | (2017.01) |
| *H01L 27/11524* | (2017.01) |

(Continued)

(52) U.S. Cl.
CPC ........ *H01L 27/11582* (2013.01); *G11C 16/04* (2013.01); *G11C 16/0475* (2013.01); *G11C 16/0483* (2013.01); *G11C 16/14* (2013.01); *G11C 16/26* (2013.01); *G11C 16/3445* (2013.01); *H01L 21/02178* (2013.01); *H01L 27/1157* (2013.01); *H01L 27/11524* (2013.01); *H01L 27/11529* (2013.01); *H01L 27/11556* (2013.01); *H01L 27/11573* (2013.01)

(58) Field of Classification Search
CPC ......... H01L 27/11582; H01L 27/11524; H01L 27/11529; H01L 27/11556; H01L 27/1157; H01L 21/02178; H01L 21/02274; H01L 29/41755; H01L 29/517; H01L 29/66825; H01L 29/66833
USPC ....................................................... 438/257
See application file for complete search history.

(56) References Cited

U.S. PATENT DOCUMENTS 8,098,520 B2    1/2012   Seigler et al.
9,362,300 B2    6/2016   Lu et al.
(Continued)

*Primary Examiner* — Long K Tran
(74) *Attorney, Agent, or Firm* — Schwegman Lundberg & Woessner, P.A.

(57) ABSTRACT

Some embodiments include apparatuses and methods having multiple decks of memory cells and associated control gates. A method includes forming a first deck having alternating conductor materials and dielectric materials and a hole containing materials extending through the conductor materials and the dielectric materials. The methods can also include forming a sacrificial material in an enlarged portion of the hole and forming a second deck of memory cells over the first deck. Additional apparatuses and methods are described.

10 Claims, 43 Drawing Sheets

Related U.S. Application Data of application No. 14/509,621, filed on Oct. 8, 2014, now Pat. No. 9,362,300.

(51) Int. Cl.
*H01L 21/02* (2006.01)
*H01L 27/1157* (2017.01)
*G11C 16/34* (2006.01)
*H01L 27/11556* (2017.01)

(56) References Cited

U.S. PATENT DOCUMENTS

| | | |
|---|---|---|
| 9,853,046 B2 | 12/2017 | Lu et al. |
| 2004/0073745 A1 | 4/2004 | Ma et al. |
| 2009/0242966 A1 | 10/2009 | Son et al. |
| 2010/0013049 A1 | 1/2010 | Tanaka et al. |
| 2012/0003800 A1 | 1/2012 | Lee et al. |
| 2012/0273867 A1* | 11/2012 | Ko .................... H01L 27/11582 257/324 |
| 2014/0003148 A1 | 1/2014 | Sun et al. |
| 2015/0123189 A1* | 5/2015 | Sun .................... H01L 27/11556 257/321 |
| 2016/0104717 A1 | 4/2016 | Lu et al. |
| 2016/0284728 A1 | 9/2016 | Lu et al. |

* cited by examiner

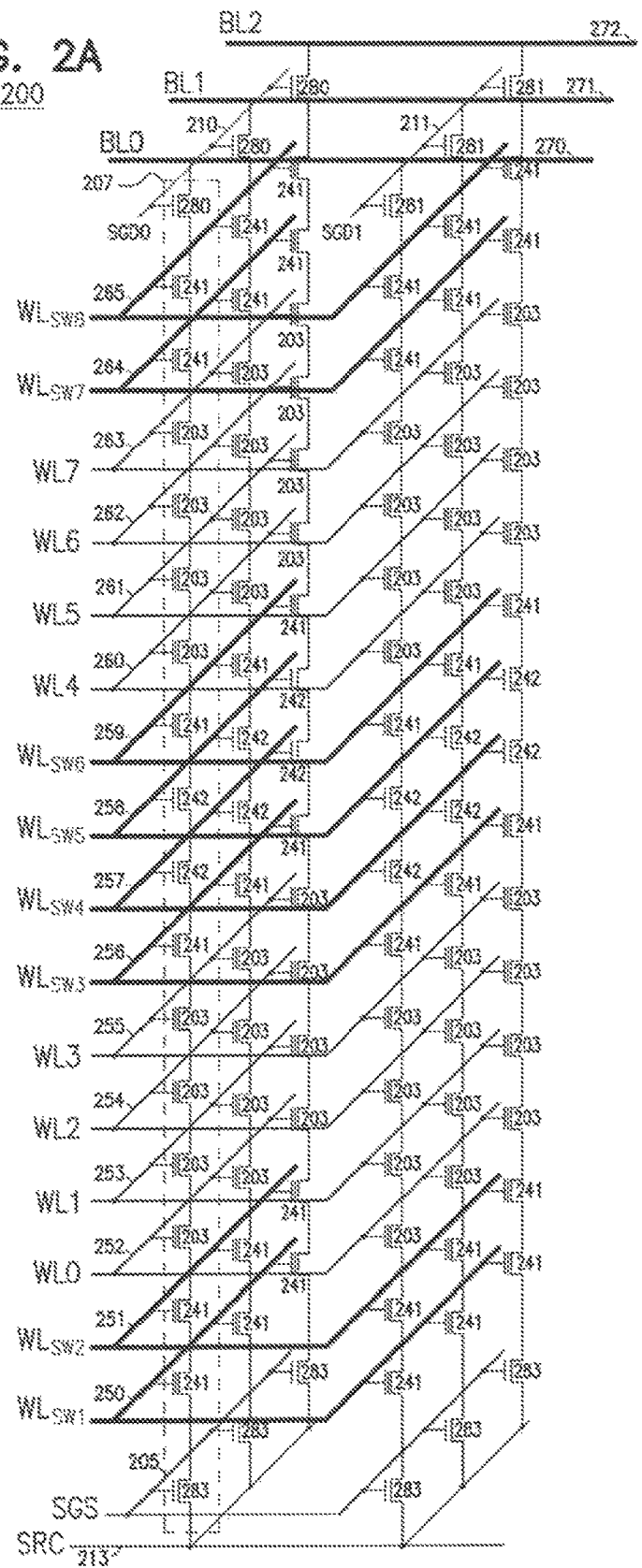

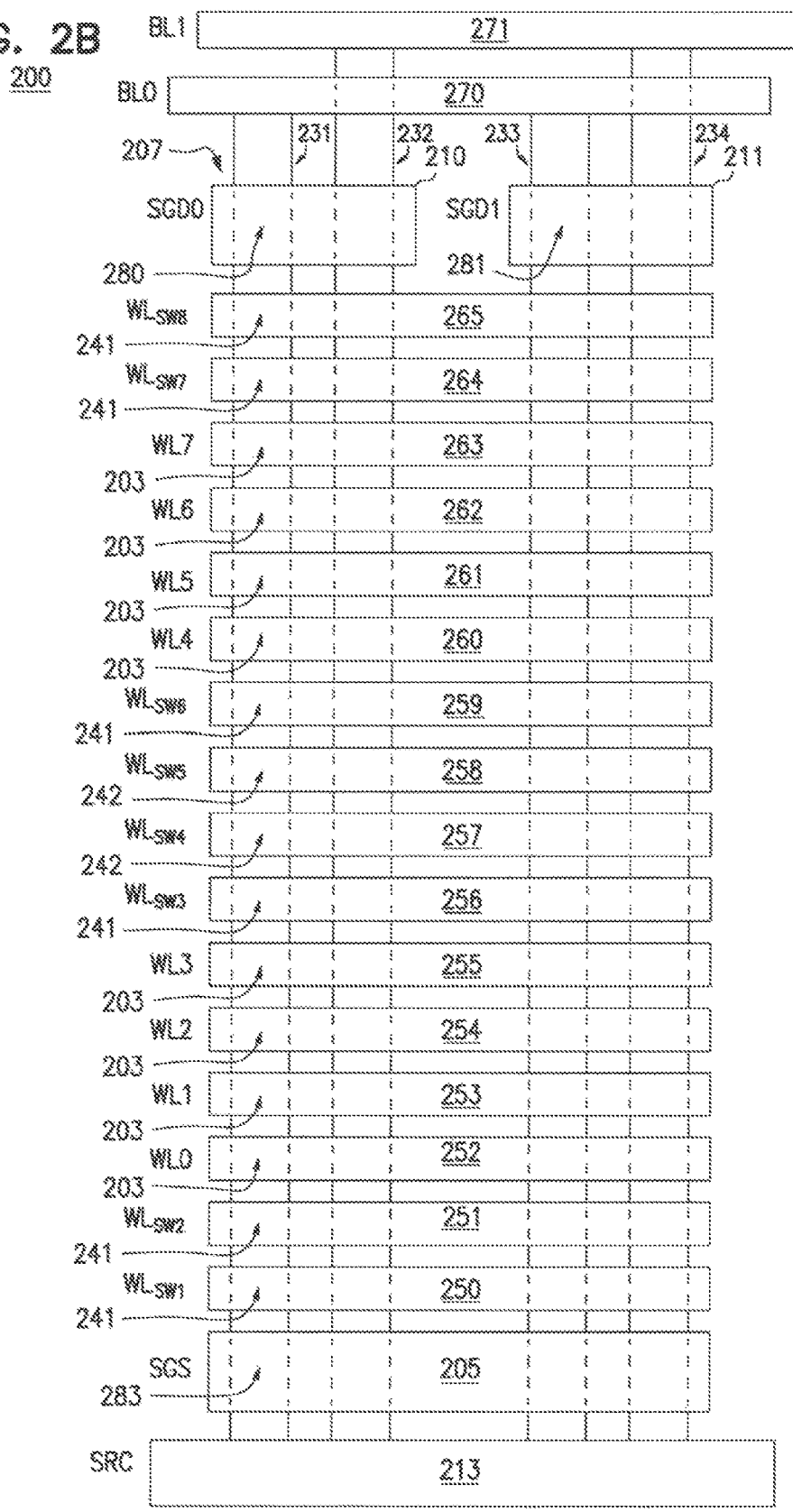

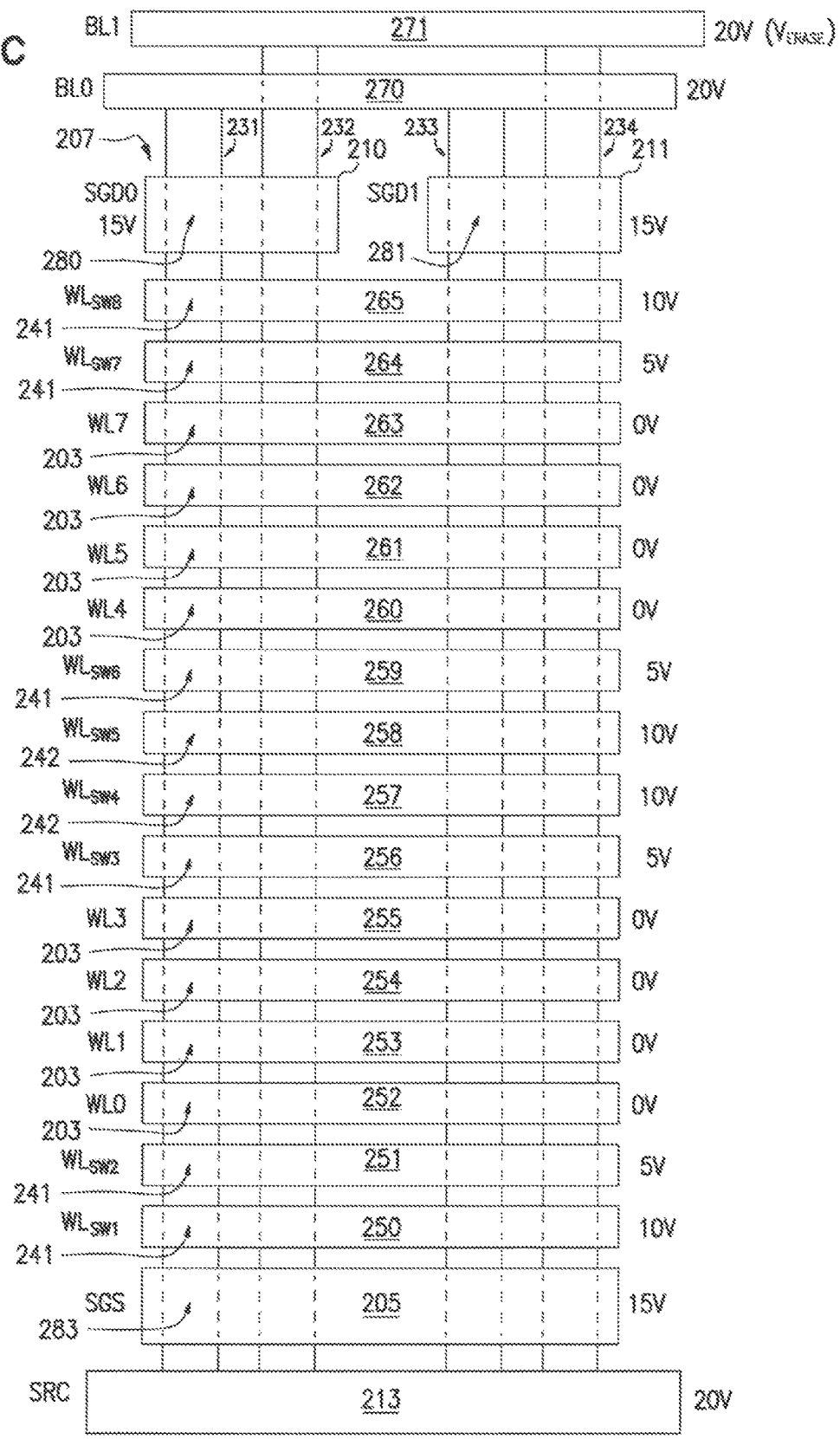

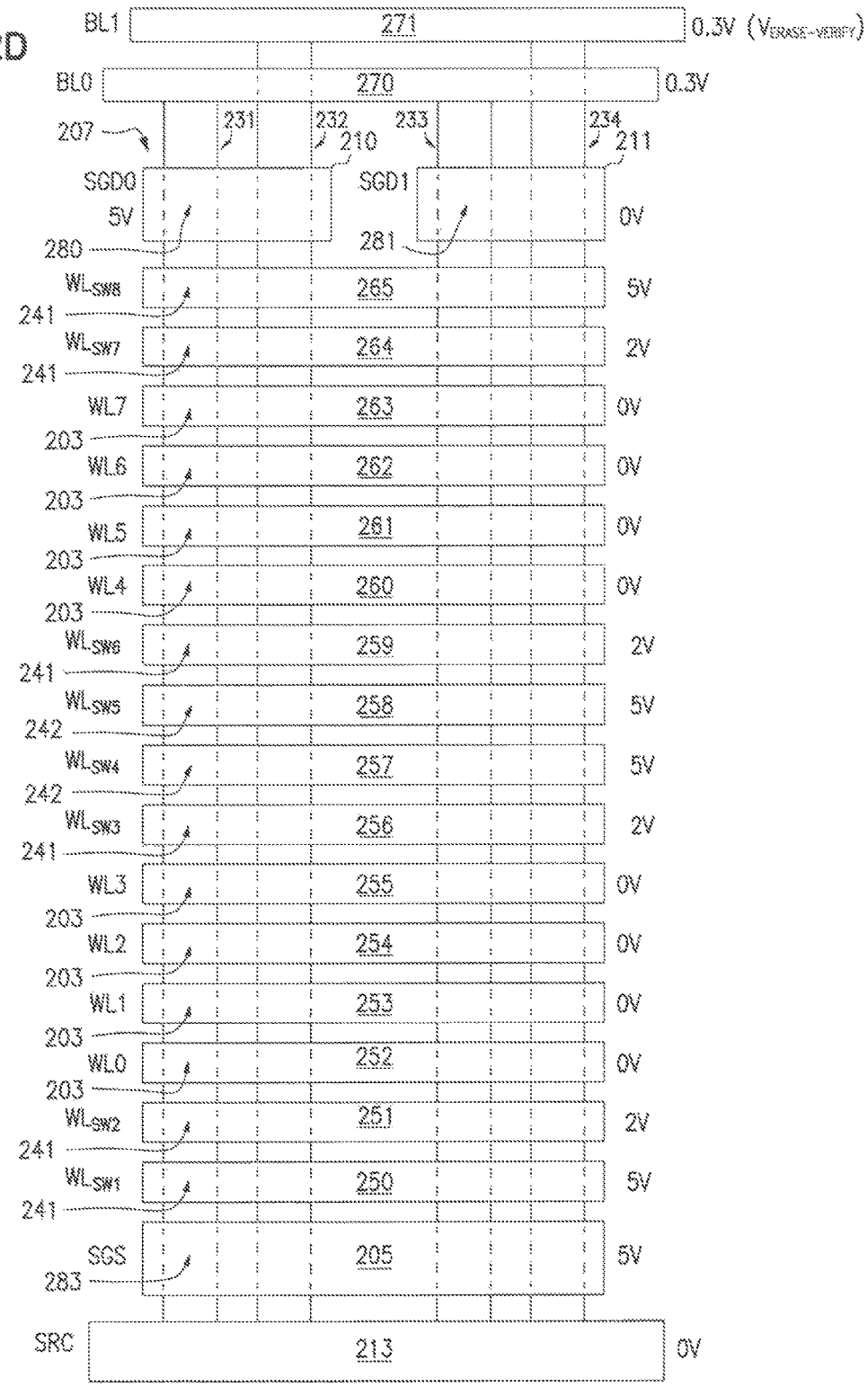

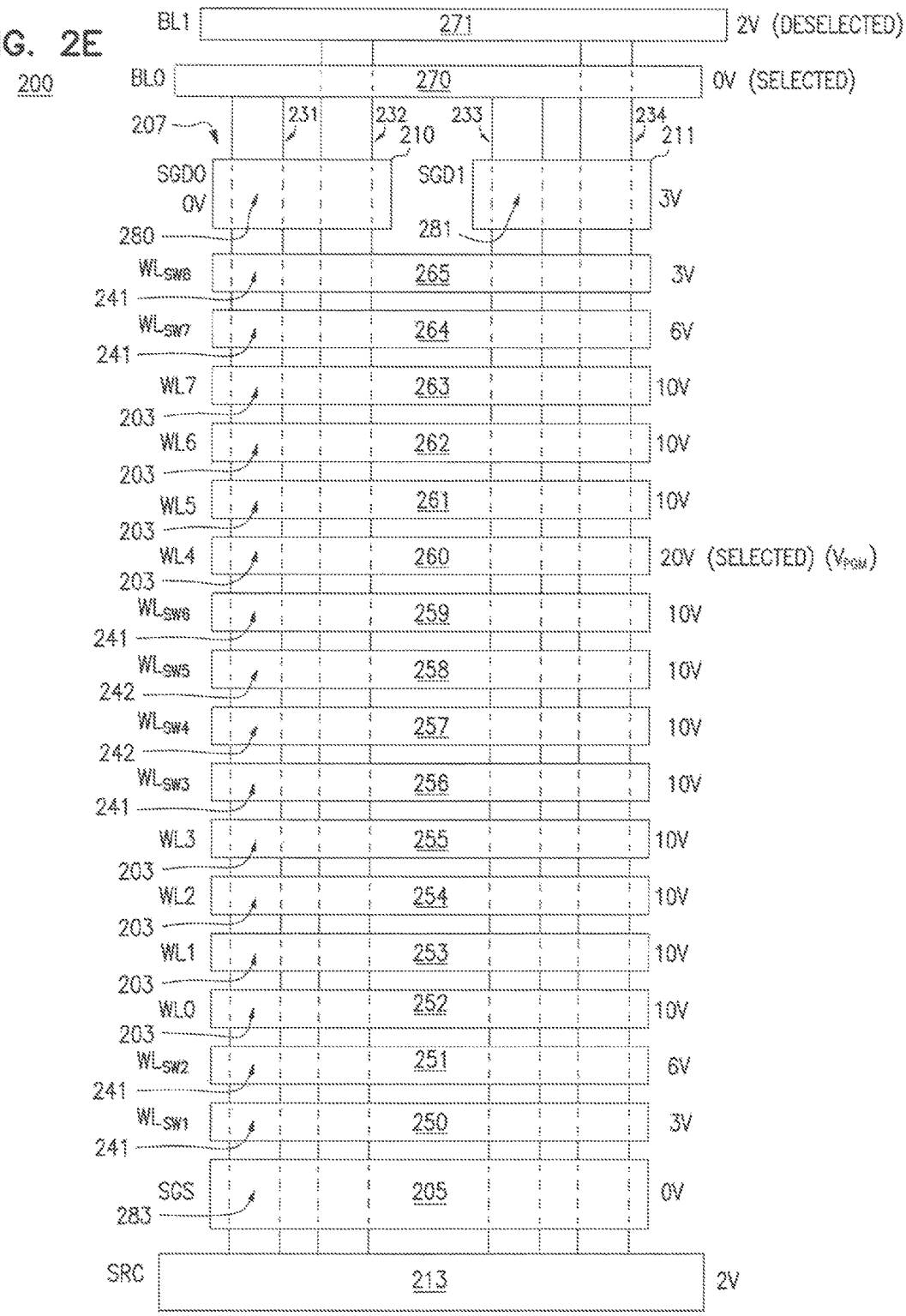

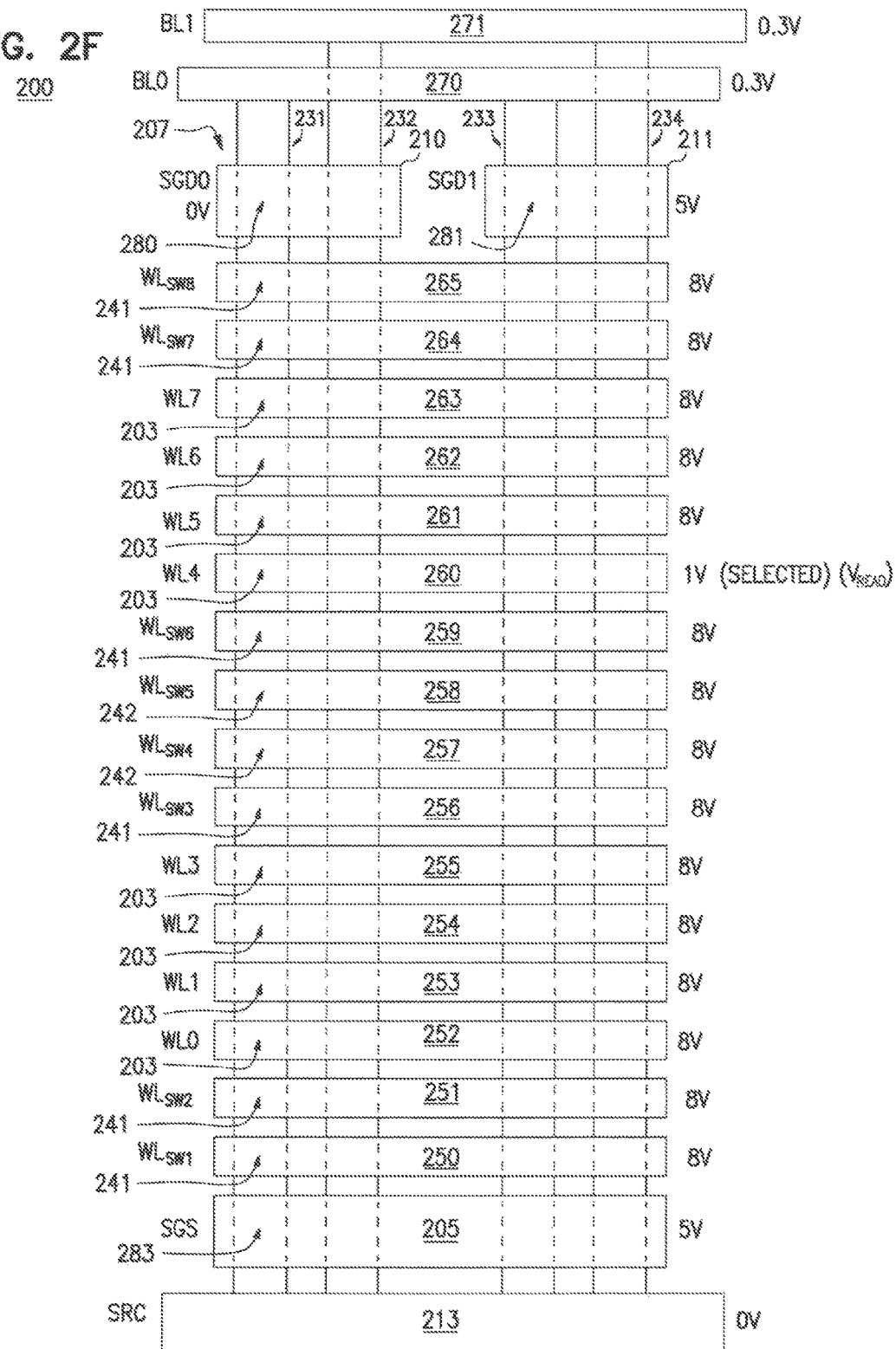

APPARATUSES AND METHODS FOR FORMING MULTIPLE DECKS OF MEMORY CELLS

PRIORITY APPLICATION

This application is a divisional of U.S. application Ser. No. 15/174,478, filed Jun. 6, 2016, which is a divisional of U.S. application Ser. No. 14/509,621, filed Oct. 8, 2014, now issued as U.S. Pat. No. 9,362,300, all of which are incorporated herein by reference in their entireties.

BACKGROUND

Many electronic systems, such as computers and mobile devices, usually include one or more memory devices to store information. Memory devices include memory cells. Some memory devices may include memory cells arranged in multiple levels of the device. As demand for storage capacity increases, the number of memory cell levels in some memory devices may be increased to accommodate the increased storage capacity. In some cases, forming such memory devices using conventional techniques may pose a challenge.

BRIEF DESCRIPTION OF THE DRAWINGS

FIG. 2A shows a schematic diagram of a memory device including memory cells and switches, according to an embodiment of the invention.

FIG. 2B shows a representation of a side view of a portion of a structure of the memory device of FIG. 2A, according to an embodiment of the invention.

FIG. 2C through FIG. 2F show example voltages applied during erase, erase verify, write, and read operations of the memory device of FIG. 2B, according to an embodiment of the invention.

DETAILED DESCRIPTION

Figure 1:
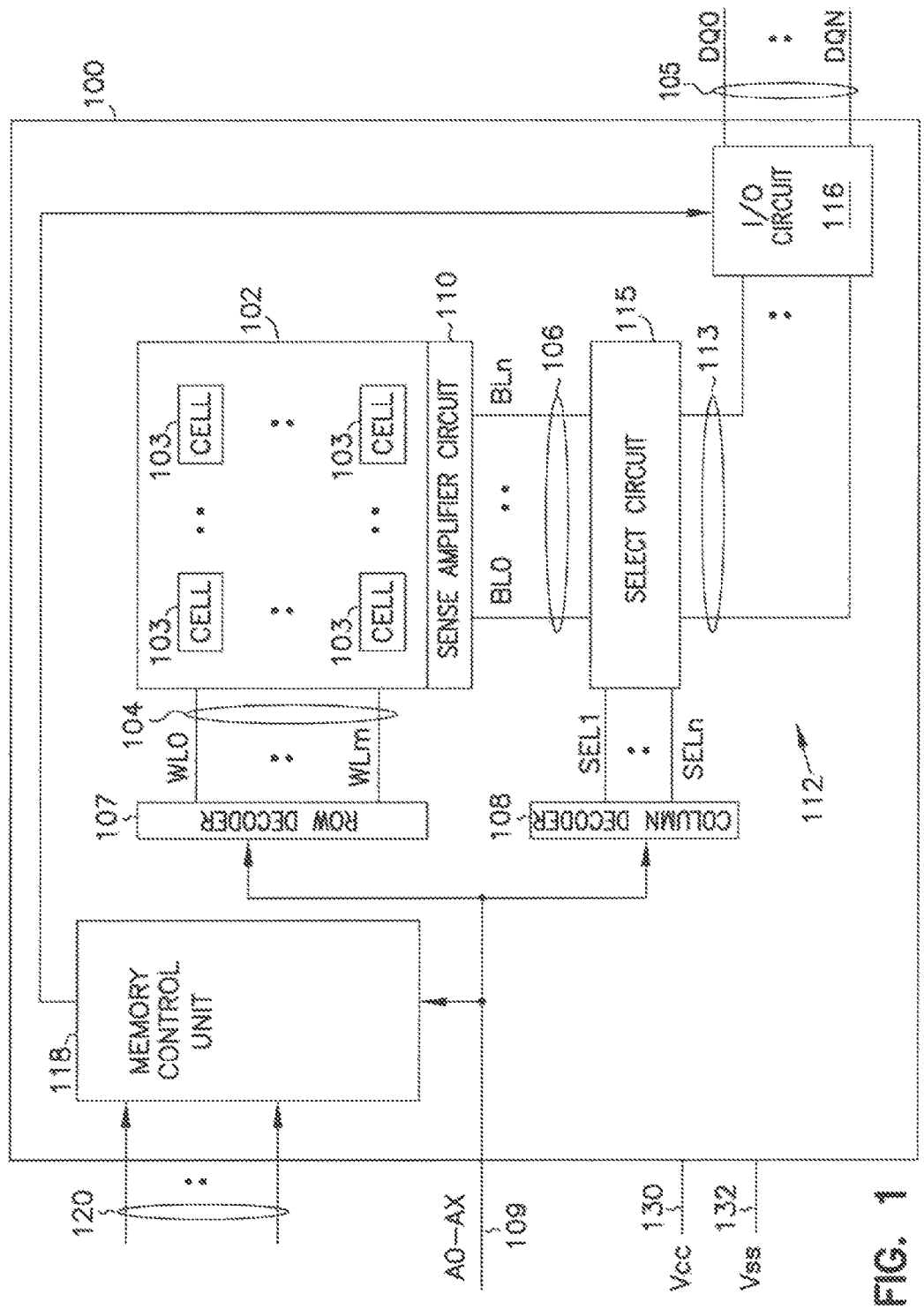
FIG. 1 shows a block diagram of an apparatus in the form of a memory device, according to an embodiment of the invention.

FIG. 1 shows a block diagram of an apparatus in the form of a memory device 100, according to an embodiment of the invention. Memory device 100 can include a memory array 102 having a number of memory cells 103. Memory cells 103 can be arranged in rows and columns along with access lines 104 (e.g., word lines to conduct signals WL0 through WLm) and data lines 106 (e.g., bit lines to conduct signals BL0 through BLn). Memory device 100 can use access lines 104 and data lines 106 to transfer information to and from memory cells 103. A row decoder 107 and a column decoder 108 decode address signals A0 through AX on address lines 109 to determine which ones of memory cells 103 are to be accessed.

A sense amplifier circuit 110 operates to determine the value of information read from memory cells 103 and transmits the information in the form of signals to data lines 106. Sense amplifier circuit 110 can also use the signals on data lines 106 to determine the values of information to be written to memory cells 103.

Memory device 100 is further shown to include circuitry 112 to transfer information between memory array 102 and input/output (I/O) lines 105. Signals DQ0 through DQN on I/O lines 105 can represent information read from or to be written into memory cells 103. I/O lines 105 can include nodes within memory device 100 (or alternatively, pins, solder balls, or other interconnect technologies such as controlled collapse chip connections (C4), or flip chip attach (FCA)) on a package where memory device 100 can reside. Other devices external to memory device 100 (e.g., a memory controller or a processor, not shown in FIG. 1) can communicate with memory device 100 through I/O lines 105, address lines 109, or control lines 120.

Memory device 100 can perform memory operations, such as a read operation, to read information from selected ones of memory cells 103; and a write operation (e.g., a programming operation) to store (e.g., to program) information in selected ones of memory cells 103. Memory device 100 can also perform an erase operation to clear information from some or all of memory cells 103. A memory control unit 118 controls memory operations based on signals present on control lines 120. Examples of the signals presented on control lines 120 can include one or more clock signals and other signals to indicate which operation (e.g., read, write, or erase operation) memory device 100 can or should perform. Other devices external to memory device 100 (e.g., a processor or a memory controller) can control the values of control signals on control lines 120. Specific combinations of values of the signals on control lines 120 can produce a command (e.g., a write, read, or erase command) that can cause memory device 100 to perform a corresponding memory operation (e.g., a write, read, or erase operation).

Each of memory cells 103 can be programmed to a different one of at least two data states to represent, for example, a value of a single bit or a value of multiple bits such as two, three, four, or a higher number of bits. For example, each of memory cells 103 can be programmed to one of two data states to represent a binary value of "0" or "1" of a single bit. Such a cell is sometimes called a single level cell. In another example, each of memory cells 103 can be programmed to one of more than two data states to represent a value of, for example, multiple bits, such as one of four possible values "00," "01," "10," and "11" of two bits, one of eight possible values "000," "001," "010," "011," "100," "101," "110," and "111" of three bits, or one of another set of values of multiple bits. A cell that can be programmed to more than two data states is sometimes referred to as a multi-level cell (or multi-state cell). Different operations on these types of cells are discussed in more detail, below.

Memory device 100 can receive a supply voltage, including supply voltage signals $V_{cc}$ and $V_{ss}$, on a supply line 130 and a supply line 132, respectively. Supply voltage signal $V_{ss}$ can, for example, be at a ground potential (e.g., having a value of approximately zero volts). Supply voltage signal $V_{ss}$ can also operate at other voltages. Supply voltage signal $V_{cc}$ can include an external voltage supplied to memory device 100 from an external power source such as a battery or an alternating-current to direct-current (AC-DC) converter circuitry (not shown in FIG. 1).

Circuitry 112 of memory device 100 is further shown to include a select circuit 115 and an I/O circuit 116. Select circuit 115 can respond to signals SEL1 through SELn to select signals on data lines 106 and 113 to represent the information read from or to be programmed into memory cells 103. Column decoder 108 can selectively activate the SEL1 through SELn signals based on the A0 through AX address signals on address lines 109. Select circuit 115 can select the signals on data lines 106 and 113 to provide communication between memory array 102 and I/O circuit 116 during read and write operations.

Memory device 100 can include a non-volatile memory device and memory cells 103 can include non-volatile memory cells, such that memory cells 103 can retain information stored therein when power (e.g., $V_{cc}$, $V_{ss}$, or both) is disconnected from memory device 100.

Each of memory cells 103 can include a memory element having material, at least a portion of which can be programmed to a desired data state (e.g., by storing a corresponding amount of charge on a charge-storage structure, such as a floating gate or charge trap). Different data states can thus represent different values of information programmed in each of memory cells 103.

Memory device 100 can perform a write operation when it receives (e.g., from an external processor or a memory controller) a write command and a value of information to be programmed into one or more selected ones of memory cells 103. Based on the value of the information, memory device 100 can program the selected memory cells to appropriate data states to represent the values of the information to be stored therein.

One of ordinary skill in the art may recognize that memory device 100 may include other components, at least some of which are discussed herein. However, several of these components are not necessarily shown in the figure, so as not to obscure the embodiments described. Memory device 100 may include devices and memory cells, and operate using memory operations (e.g., read, write, and erase operations) similar to, or identical to, those described below with reference to FIG. 2A through FIG. 6G.

FIG. 2A shows schematic diagram of a memory device 200 including memory cells 203 and switches 241 and 242, according to an embodiment of the invention. Memory device 200 can include data lines 270, 271, and 272 (e.g., bit lines) that can conduct corresponding signals BL0, BL1, and BL2. Data lines 270, 271, and 272 can correspond to data lines 106 of FIG. 1. FIG. 2A shows memory device 200 having three data lines 270, 271, and 272 as an example. However, the number of data lines can vary.

Memory device 200 can include select lines (e.g., drain-side select lines) 210 and 211, a select line (e.g., source-side select line) 205, and a source (e.g., source line) 233 that can conduct a signal SRC. Select lines 210 can conduct a signal SGD0 to control (e.g., turn or turn off) select transistors 280. Select line 211 can conduct a signal SGD1 to control (e.g., turn or turn off) select transistors 281. Select line 205 can conduct a signal SCS to control (e.g., turn or turn off) select transistors 283.

Memory device 200 can include control gates 250 through 265 that can be part of access lines (e.g., word lines) to conduct corresponding signals WL0 through WL7 and $WL_{SW1}$ to $WL_{SW8}$. The access lines (that include control gates 250 through 265) of memory device 200 can correspond to access lines 104 of FIG. 1. FIG. 2A shows memory device 200 having 16 control gates 250 through 265 as an example. However, the number of control gates can vary.

Control gates 252 through 255 and 260 through 263 can respond to signals WL0 through WL3 and WL4 though WL7, respectively, to access memory cells 203.

Control gates 250, 251, 256, 259, 264, and 265 can respond to signals $WL_{SW1}$, $WL_{SW2}$, $WL_{SW3}$, $WL_{SW6}$, $WL_{SW7}$, and $WL_{SW8}$, respectively, to control (e.g., turn or turn off) corresponding switches 241.

Control gates 257 and 258 can respond to signals $WL_{SW4}$ and $WL_{SW5}$, respectively, to control (e.g., turn or turn off) corresponding switches 242. Each of control gates 257 and 258 can have an insulated transistor-gate structure (e.g., a metal-oxide-semiconductor (MOS) gate structure, or another type of insulated gate structure), such that switches 242 can operate as transistors (e.g., MOS transistors) when control gates 257 and 258 respond to signals $WL_{SW4}$ and $WL_{SW5}$.

Memory cells 203 and switches 241 and 242 can be organized in different strings (e.g., strings including memory cells) between source 213 and each of data lines 270, 271, and 271. For example, FIG. 2A shows string 207 including some of memory cells 203 and some of switches 241 and 242 coupled between source 213 and data line 270. FIG. 2A shows memory device 200 having six strings as an example. However, the number of strings can vary.

Switches 241 (controlled by control gates 250, 251, 256, 259, 264, 265) can have the same structures (e.g., memory cell structures) as that of memory cells 203. However, unlike the memory cells 203, the structures of switches 241 may not be configured to store information. Switches 241 may be configured to operate as transistors (e.g., pass transistors) to conduct current in corresponding strings during operations of memory device 200. For example, in string 207, switches 241 can operate as transistors to conduct current in string 207 between source 213 and data line 270.

Switches 242 (controlled by control gates 257 and 258) can have structures different from that of switches 241 and memory cells 203. Switches 242 may be configured to operate as transistors (e.g., pass transistors) to conduct current in corresponding strings during operations of memory device 200. For example, in string 207, switches 242 can operate as transistors (e.g., pass transistors) to conduct current in string 207 between source 213 and data line 270.

Some of the reasons for including switches 241 and 242 in the same string as memory cells 203 are discussed below with reference to FIG. 2B.

FIG. 2B shows a representation of side view of a portion of a structure of memory device 200 of FIG. 2A, according to an embodiment of the invention. For simplicity, FIG. 2B shows only two data lines 270 and 271 and four strings (including string 207) of FIG. 2A. As shown in FIG. 2B memory cells 203, switches 241 and 242 and control gates 250 through 265 can be located in different levels of memory device 200. For example, control gates 250 through 255 (associated with signals $WL_{SW1}$, $WL_{SW2}$, and WL0 through WL3) and memory cells 203 controlled by control gates 250 through 255 can be located in a portion (e.g., bottom portion) of memory device 200. Control gates 260 through 265 (associated with signals WL4 through WL7, $WL_{SW7}$, and $WL_{SW8}$) and memory cells 203 controlled by control gates 260 through 263 can be located in another portion (e.g., top portion) of memory device 200. Control gates 256 through 259 (associated with signals $WL_{SW3}$ through $WL_{SW6}$) and switches 241 and 242 controlled by control gates 256 through 259 can be located in levels between control gates 250 through 255 (associated with signals WL0 through WL3) and control gates 260 through 263 (associated with signals WL4 through WL7).

FIG. 2B also shows four pillars 231, 232, 233, and 234 associated with four strings of memory device 200. Each of pillars 231, 232, 233, and 234 can contain materials (e.g., a hole filled with materials) extending through control gates 250 through 265. At least one the materials in a pillar can include a conductive material (or conductive materials) configured to operate as a channel to conduct current between source 213 and one of data lines 270, 271, and 272 during an operation of memory device 200.

Some fabrication processes to form memory device 200 (e.g., some of the processes described below with reference to FIG. 3A through FIG. 6G) may change memory cell structures associated with some of the control gates 250 through 265. For example, memory cell structures associated with control gates 257 and 258 may change to different structures (e.g., transistors) that can be configured to operate as switches (e.g., switches 242). In some operations (e.g., read, write, and erase operations) of memory device 200, certain biases (e.g., voltages) can be applied to control gates 257 and 258. These biases may create high electric field or parasitic coupling (or both) between control gates 257 and 256 and between control gates 258 and 259. During such operations, biases having specific values are also applied to control gates 256 and 259. The difference between the biases applied to control gates 257 and 258 and the biases applied to control gates 256 and 259 during such operations may prevent memory cell structures associated with control gates 256 and 259 to be reliably configured to operate as memory cells. Thus, memory cell structures associated with control gate 256 and 259 may not be configured to operate as memory cells. However, in order to maintain channel continuity and current in a string (e.g., string 207), the memory cell structures associated with control gate 256 and 259 can be configured to operate as switches (e.g., switches 241 controlled by control gates 256 and 259).

Similarly, during some operations, high electric field or parasitic coupling (or both) may also occur between select lines 210 and 211 and control gates 264 and 265 and between select line 205 and control gates 250 and 251. Thus, although control gates 250, 251, 264, and 265 are associated with memory cell structures, such memory cell structures may not be configured to operate as memory cells but they can be configured to operate as switches (e.g., switches 241 controlled by control gates 250, 251, 264, and 265).

In operation (e.g., read, write, or erase operation), memory device 200 may apply different biases (e.g., apply different voltages) to control gates 250 through 265, depending on which operation is being performed and which memory cells are selected and deselected (unselected) for the operation.

FIG. 2C shows example voltages applied to data lines 270 and 271, select lines 210 and 211, control gates 250 through 265, select line 205, and source 213 during an erase operation of memory device 200, according to an embodiment of the invention.

During an erase operation, a voltage (e.g., 10V provided by signals $WL_{SW4}$ and $WL_{SW8}$) applied to control gates 257 and 258 (associated switches 242) can be greater than (e.g., more positive than) a voltage (e.g., 0V provided by signals WL0 through WL3 and WL4 through WL7) applied to control gates 252 through 255 and 260 through 263 (associated memory cells 203).

During an erase operation, a voltage (e.g., 5V provided by signals $WL_{SW3}$ and $WL_{SW6}$) applied to control gates 256 and 259 (associated with switches 241) can be between a voltage (e.g., 0V) applied to control gates 252 through 255 and 260 through 263 (associated with and memory cells 203) and a voltage (e.g., 10V) applied to control gates 257 and 258 (associated with switches 242).

During an erase operation, the voltage (e.g. $V_{ERASE}$=20V) applied to data lines 270 and 271 and voltages applied to select lines 210 and 211, control gates 250, 251, 264, and 265, select line 205, and source 213 can have values relative to each other (less than, equal to, or greater than) as shown by example values in FIG. 2C.

FIG. 2D shows example voltages applied to data lines 270 and 271, select lines 210 and 211, control gates 250 through 265, select line 205, and source 213 during an erase verify operation of memory device 200, according to an embodiment of the invention.

During an erase verify operation, a voltage (e.g., 5V provided by signals $WL_{SW4}$ and $WL_{SW8}$) applied to control gates 257 and 258 (associated with switches 242) can be greater than (e.g., more positive than) a voltage (e.g., 0V provided by signals WL0 through WL3 and WL4 through WL7) applied to control gates 252 through 255 and 260 through 263 (associated with memory cells 203).

During an erase verify operation, a voltage (e.g., 2V provided by signals $WL_{SW3}$ and $WL_{SW6}$) applied to control gates 256 and 259 (associated with switches 241) can be between a voltage (e.g., 0V) applied to control gates 252 through 255 and 260 through 263 (associated with memory cells 203) and a voltage (e.g., 5V) applied to control gates 257 and 258 (associated with switches 242).

During an erase verify operation, the voltage (e.g., $V_{ERASE-VERIFY}$=0.3V) applied to data lines 270 and 271 and voltages applied to select lines 210 and 211, control gates 250, 251, 264, and 265, select line 205, and source 213 can have values relative to each other (less than, equal to, or greater than) as shown by example values in FIG. 2D.

FIG. 2E shows example voltages applied to data lines 270 and 271, select lines 210 and 211, control gates 250 through 265, select line 205, and source 213 during a write (e.g., programming) operation of memory device 200, according to an embodiment of the invention.

During a write operation, a voltage (e.g., 10V) applied to control gates 256 through 259 can be the same as a voltage (e.g., 10V) applied to deselected (e.g., unselected) control gates among control gates 252 through 255 and 260 through 263. FIG. 2E shows an example where control gates 252 through 255 and 261 through 264 are deselected control gates (associated with unselected memory cells 203). Control gate 260 is a selected control gate (associated with selected memory cells 203 to store information). FIG. 2E also shows an example where data line 270 is a deselected data line (which is coupled to deselected strings) and data line 271 is a selected data line (which is coupled to selected string having a memory cell being selected to store information).

During a write operation, the voltage applied to the selected control gate 260 (e.g., $V_{PGR}$=20V) and the voltages applied to data lines 270 and 271, select lines 210 and 211, control gates 250, 251, 264, and 265, select line 205, and source 213 can have values relative to each other (less than, equal to, or greater than) as shown by example values in FIG. 2E.

FIG. 2F shows example voltages applied to data lines 270 and 271, select lines 210 and 211, control gates 250 through 265, select line 205, and source 213 during a read operation or write verify operation of memory device 200, according to an embodiment of the invention.

During a read operation (or a write verify operation), a voltage (e.g., 8V) applied to control gates 256 through 259 can be the same as a voltage (e.g., 8V) applied to a deselected control gates among control gates 252 through 255 and 260 through 263. FIG. 2F shows an example where control gates 252 through 255 and 261 through 264 are deselected control gates (associated with unselected memory cells 203). Control gate 260 is a selected control gate (associated with selected memory cells 203 where information is to be obtained (e.g., read)).

During a read operation (or a write verify operation), the voltage applied to the selected control gate 260 (e.g., $V_{READ}=1$ V) and the voltages applied to data lines 270 and 271, select lines 210 and 211, control gates 250, 251, 264, and 265, select line 205, and source 213 can have values relative to each other (less than, equal to, or greater than) as shown by example values in FIG. 2F.

In FIG. 2C through FIG. 2F, the values of voltages are used as examples. The values of such voltages can be different from the values shown in FIG. 2C through FIG. 2F.

The structure of memory device 200 (e.g., FIG. 2A through FIG. 2F) can be formed using a deck-by-deck process. In this process, some of the control gates and associated memory cells and switches can be formed first (e.g., in one deck). Then, the other control gates and associated memory cells and switches can be formed (e.g., in another deck). For example, in FIG. 2B, control gates 250 through 258 and associated memory cells 203 and switches 241 and 242 (located in the same levels as control gates 250 through 258) can be formed in a bottom deck memory device 200. Then, control gates 259 through 265 and associated memory cells 203 and switches 241 and 242 (located in the same levels as control gates 259 through 265) can be formed in a top deck stacked over the bottom deck memory device 200.

Figure 3A:
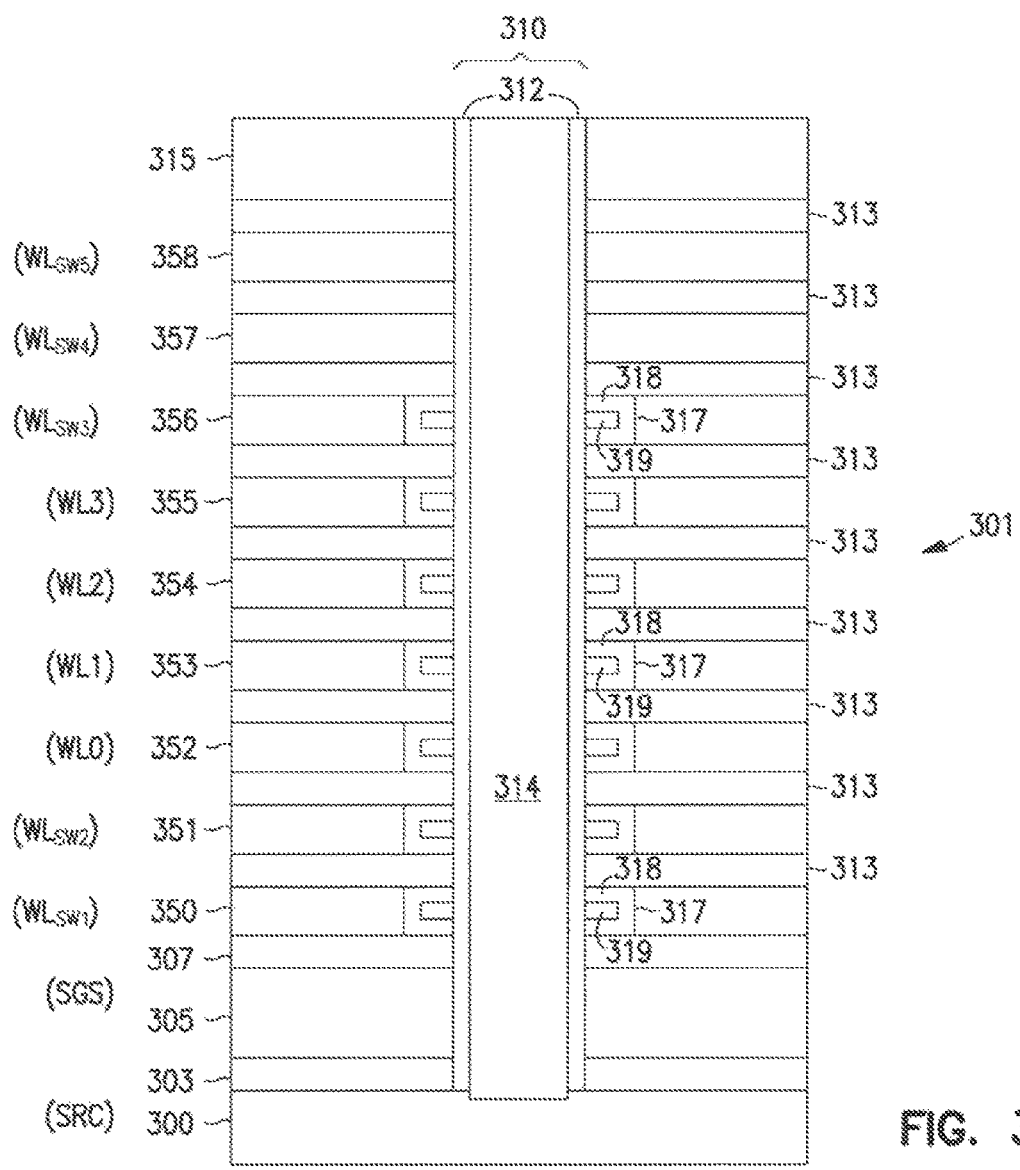
FIG. 3A through FIG. 3S show different portions of fabrication processes of forming a memory device, according to an embodiment of the invention.
Figure 3B:
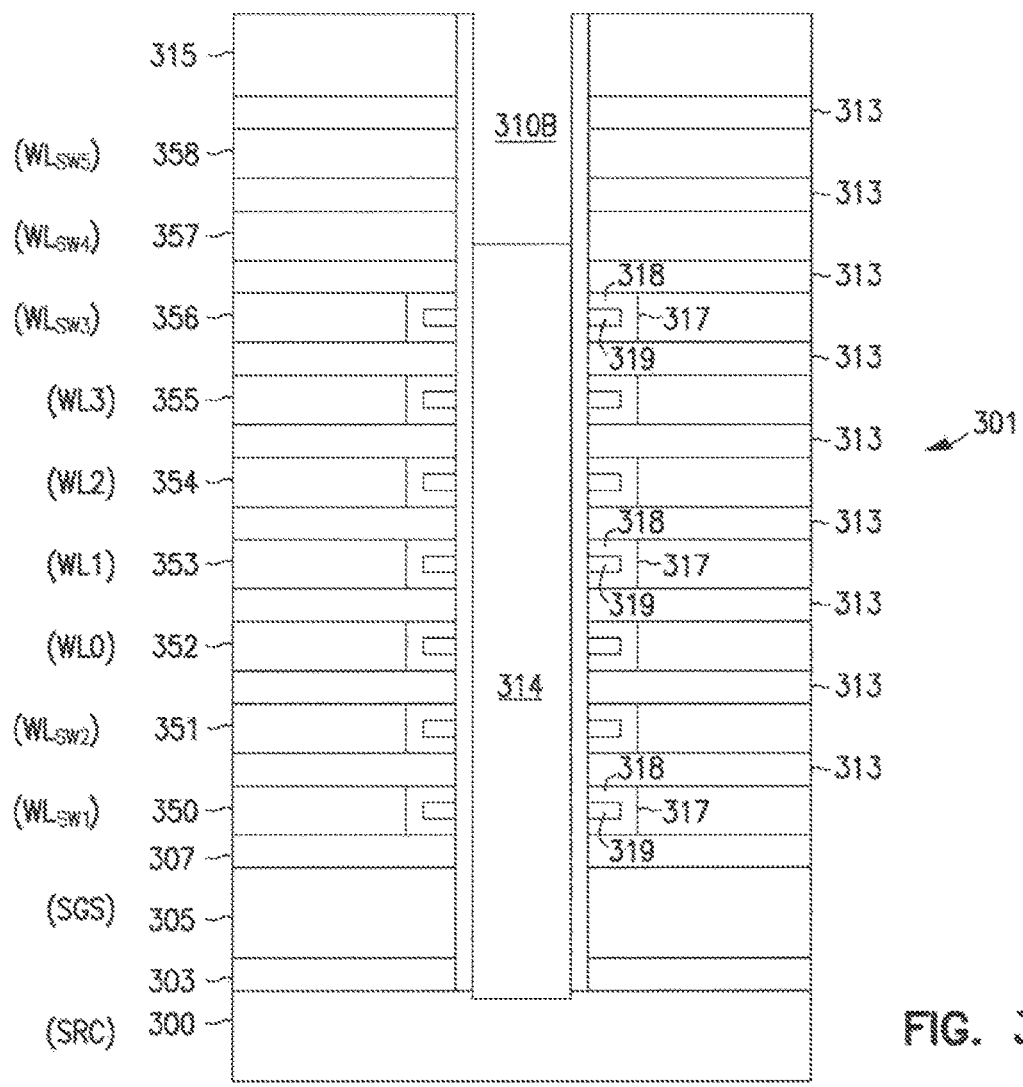
Figure 3C:
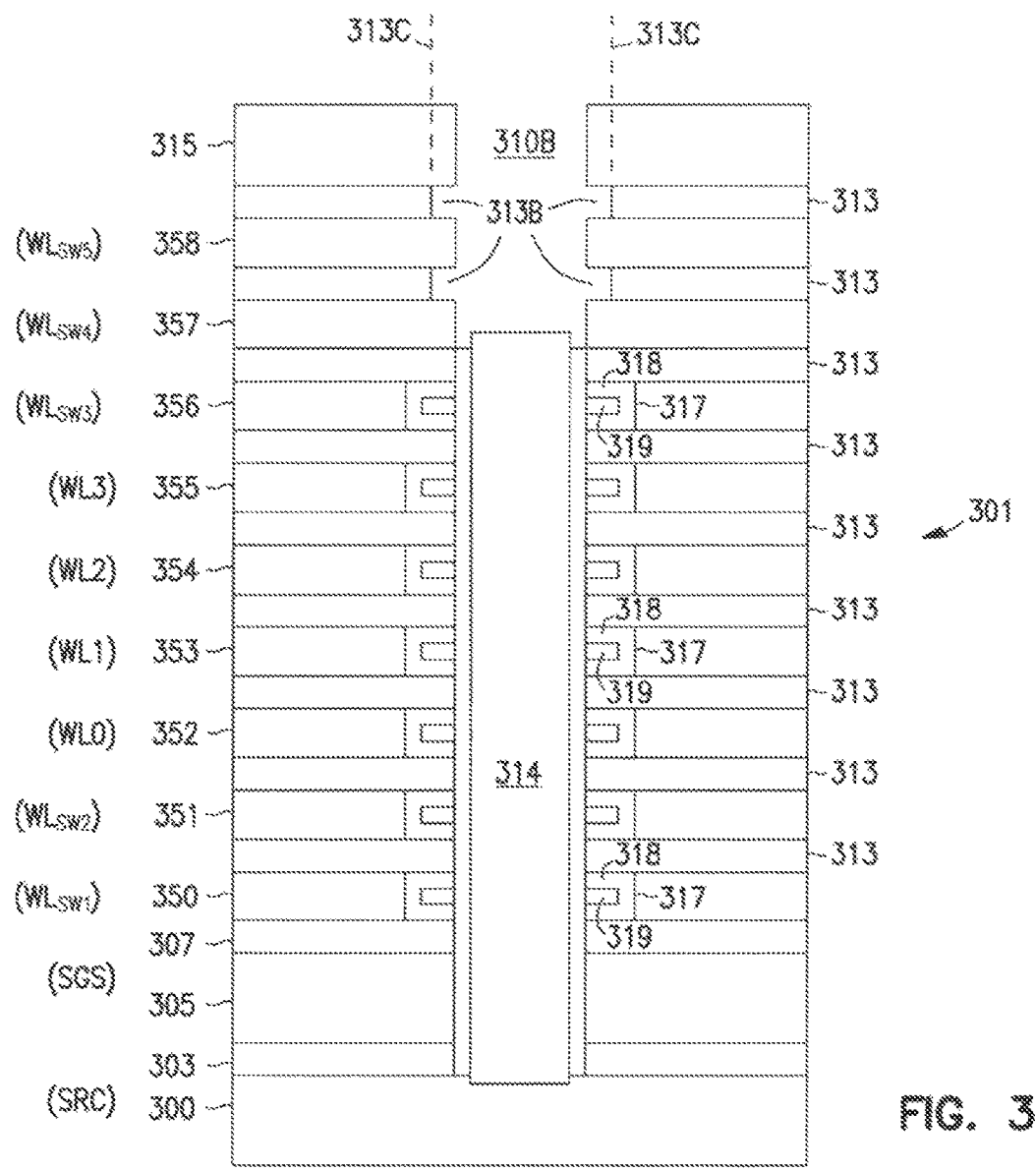
Figure 3D:
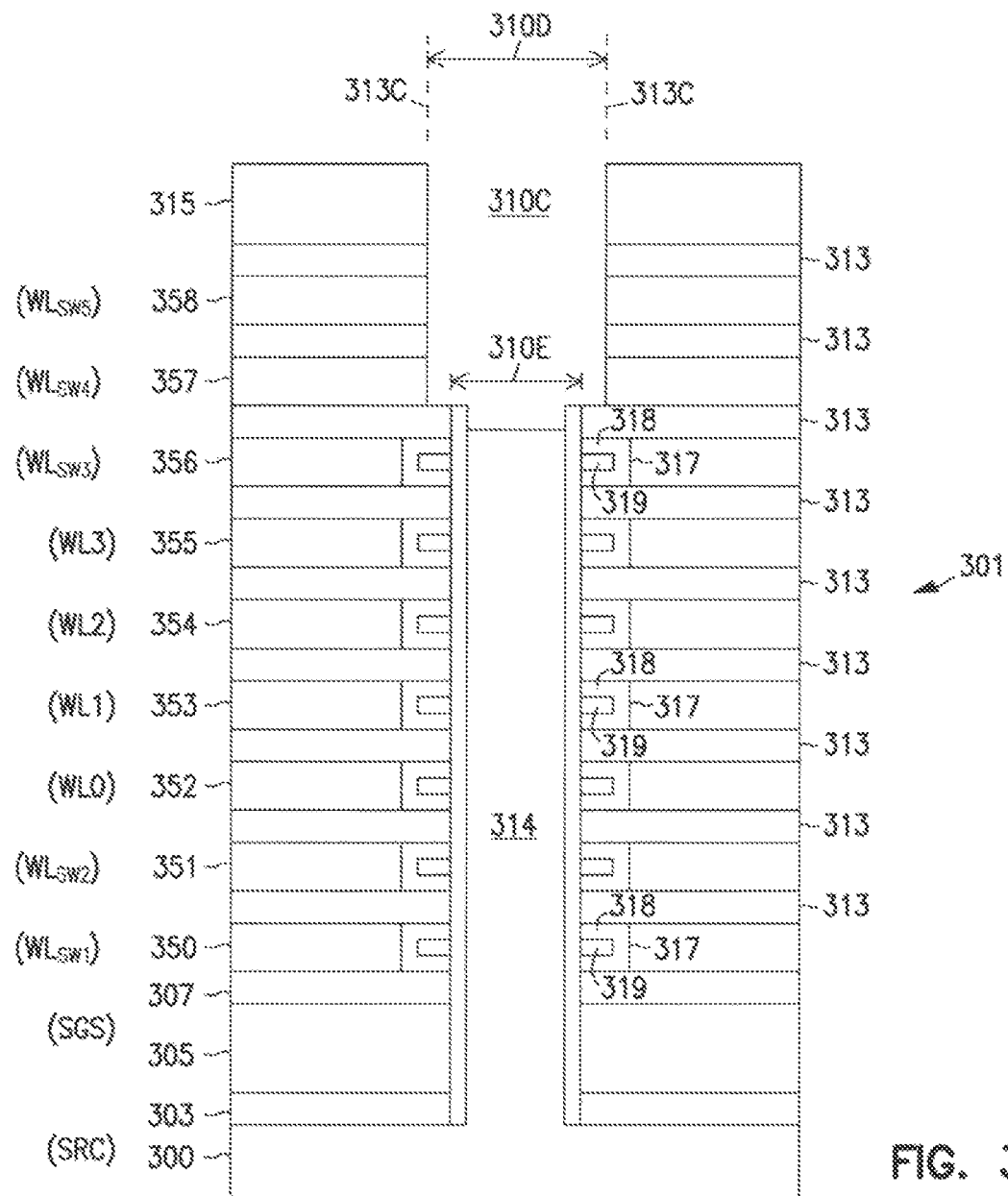
Figure 3E:
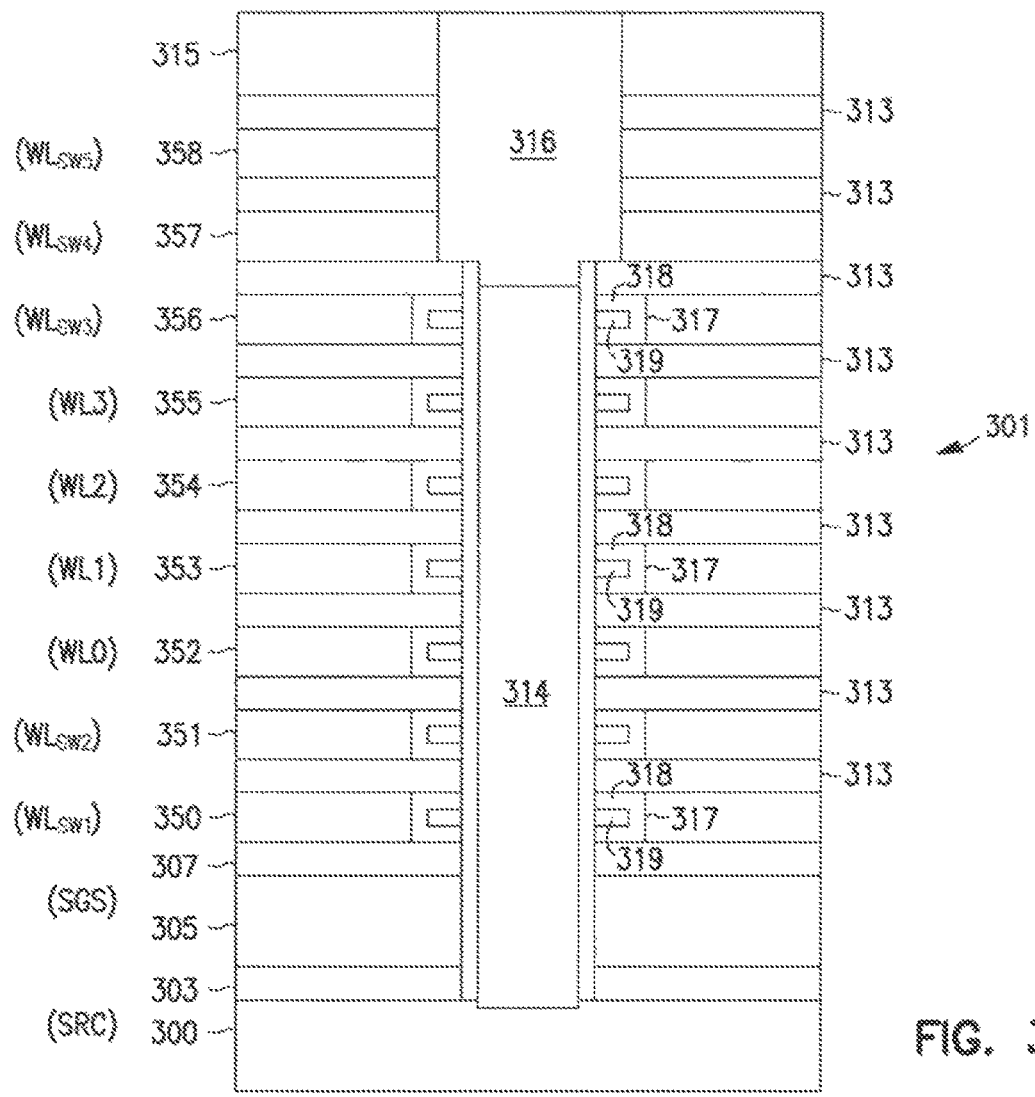
Figure 3F:
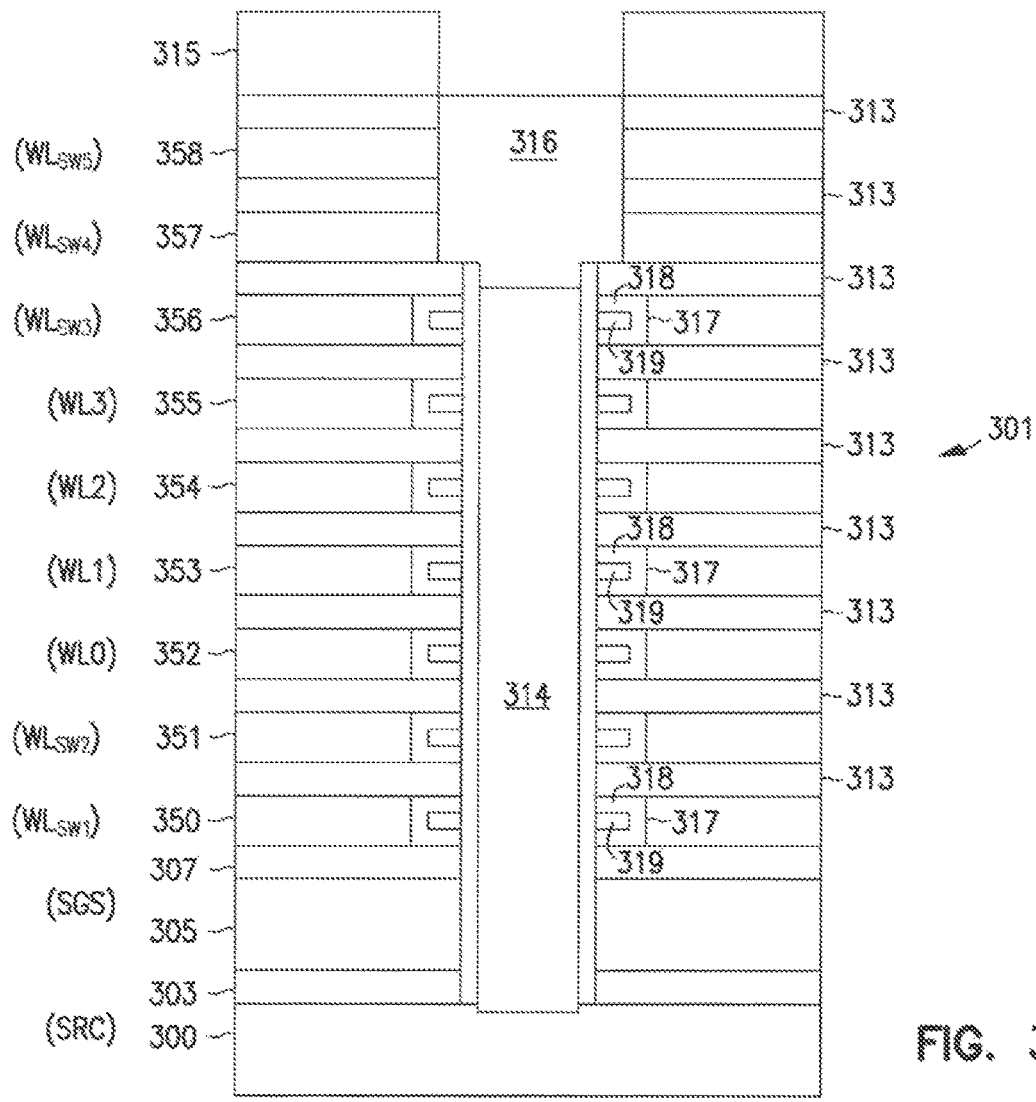
Figure 3G:
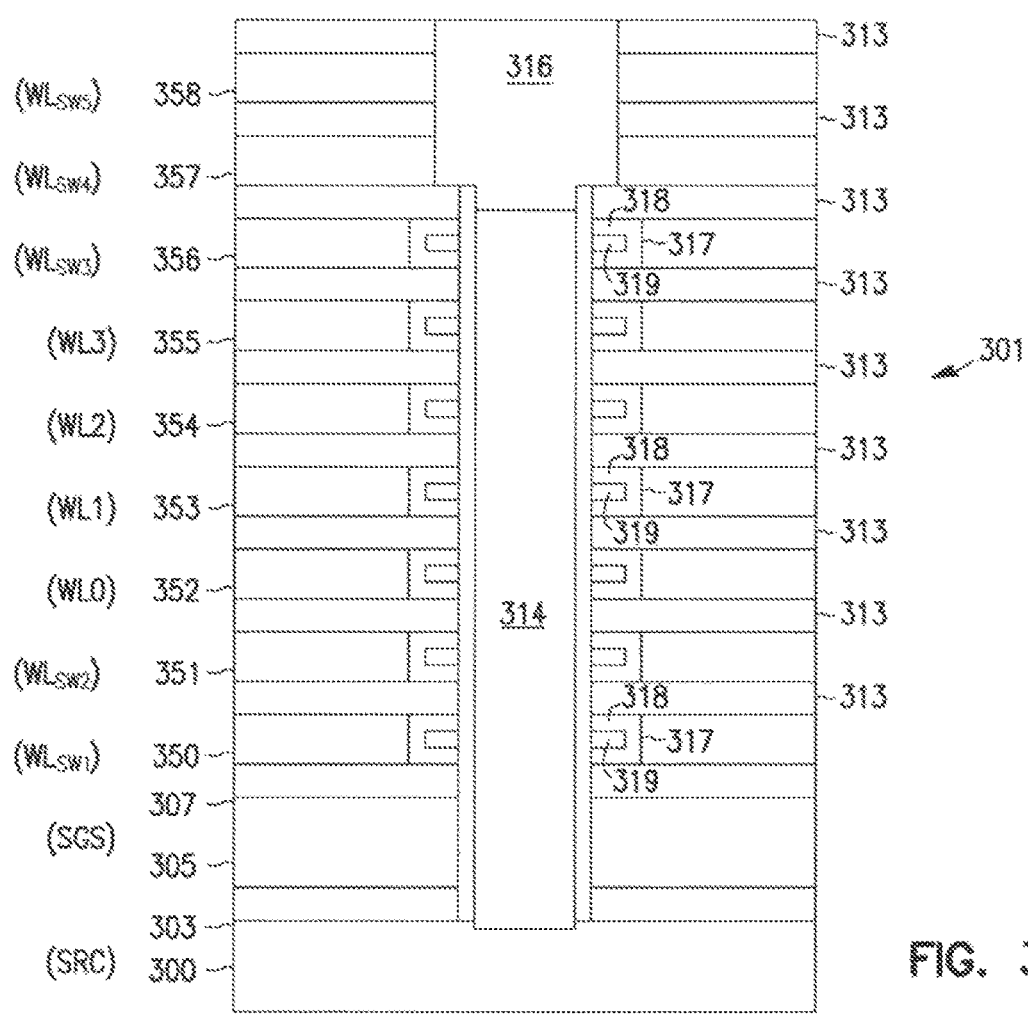
Figure 3H:
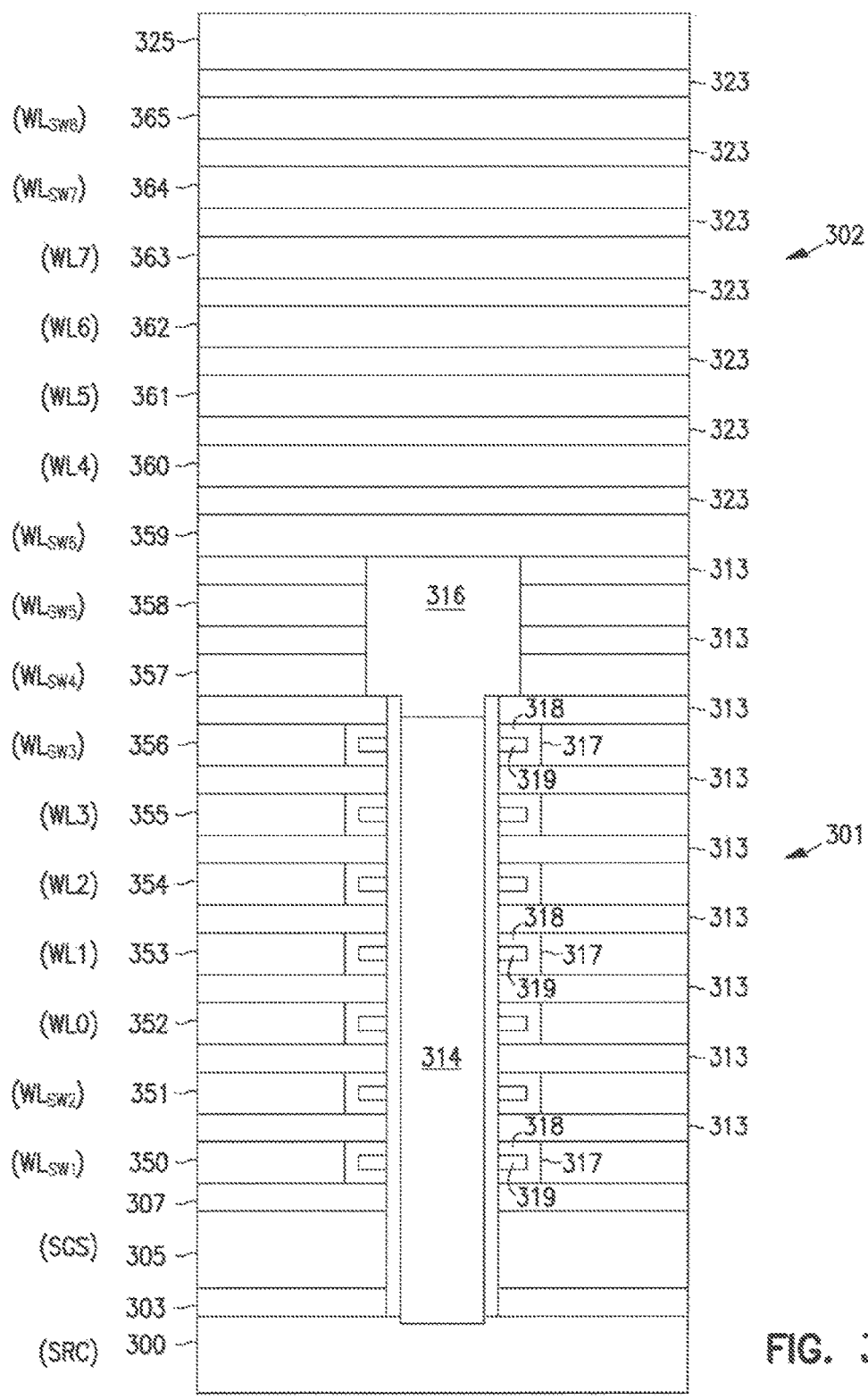
Figure 31:
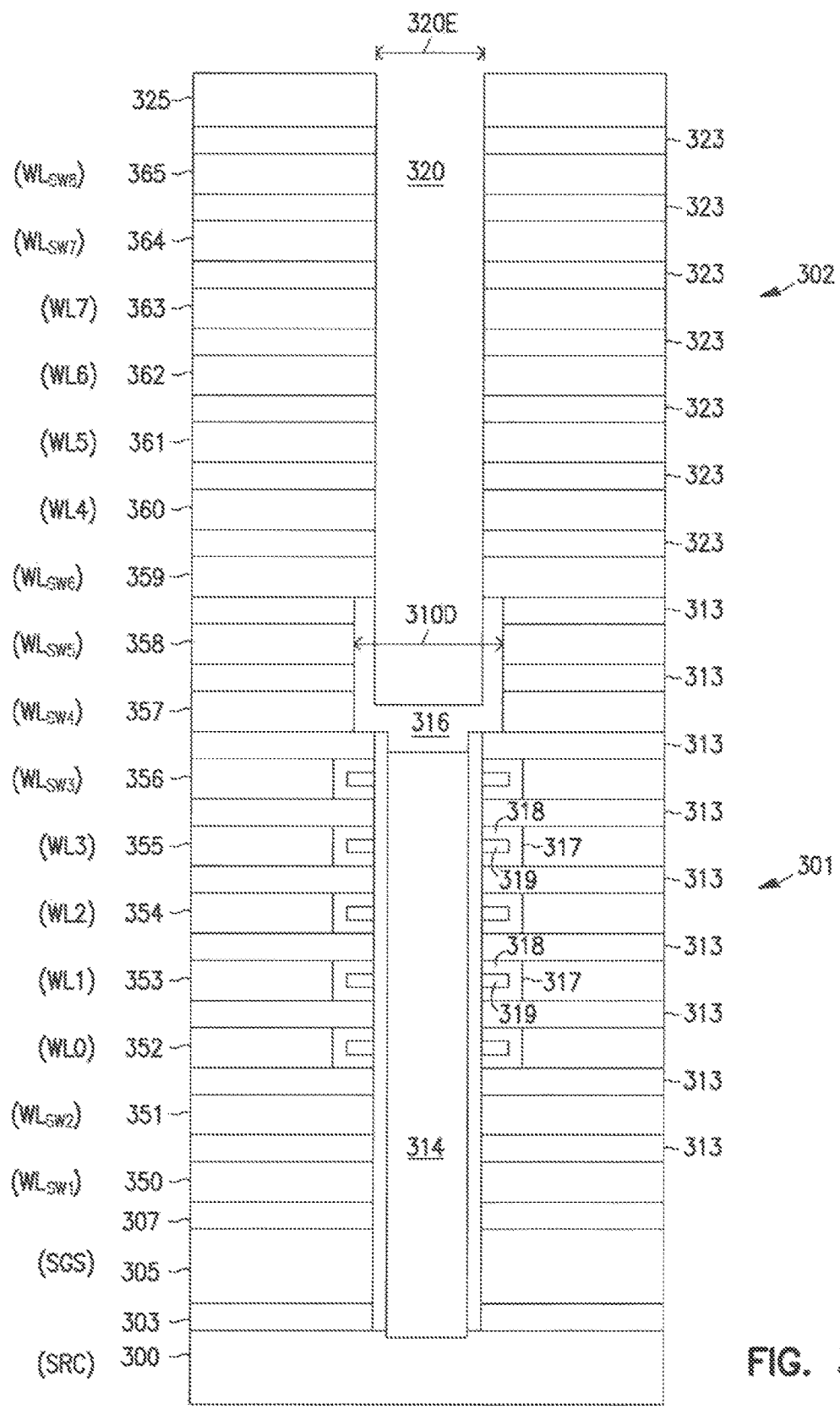
Figure 3J:
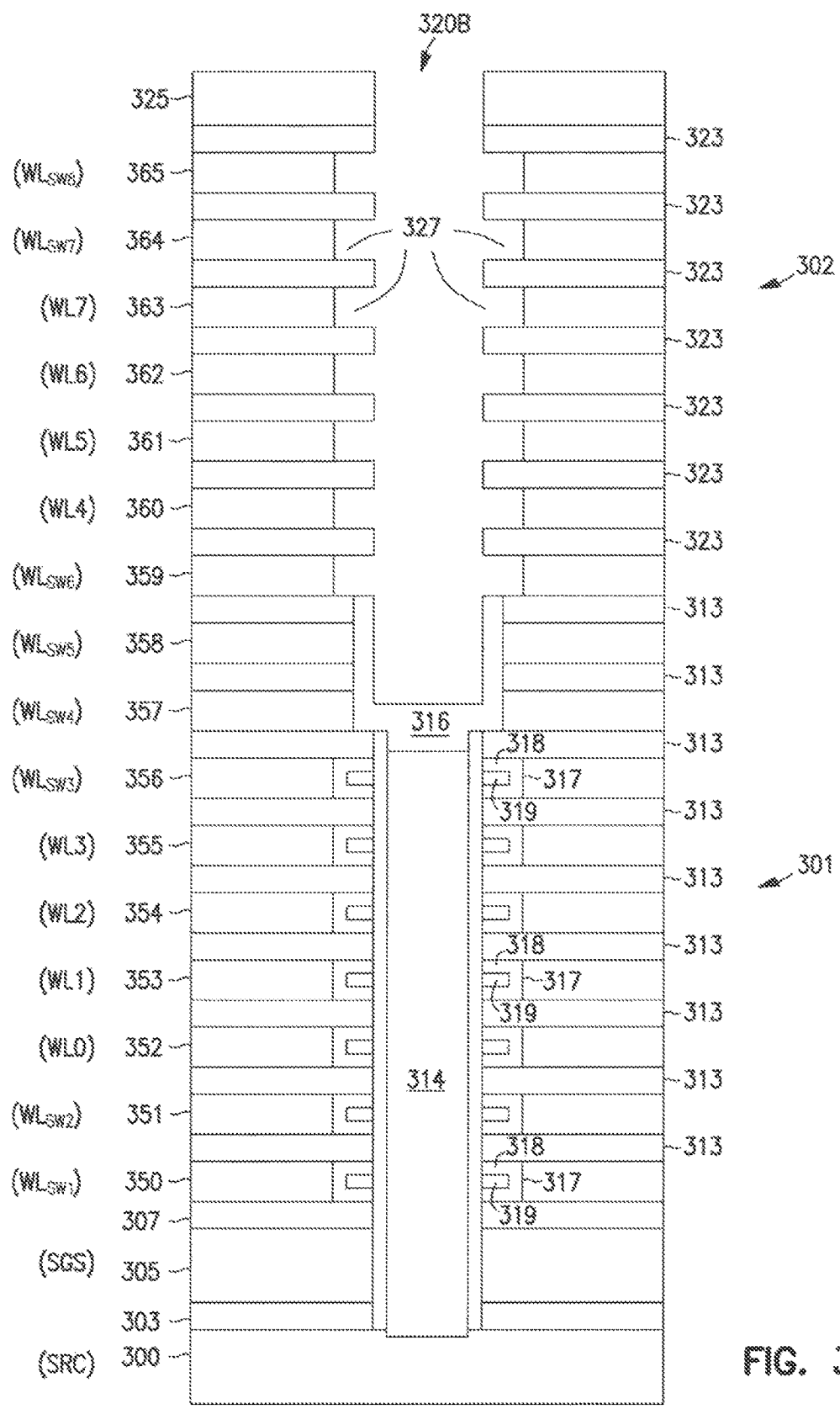
Figure 3K:
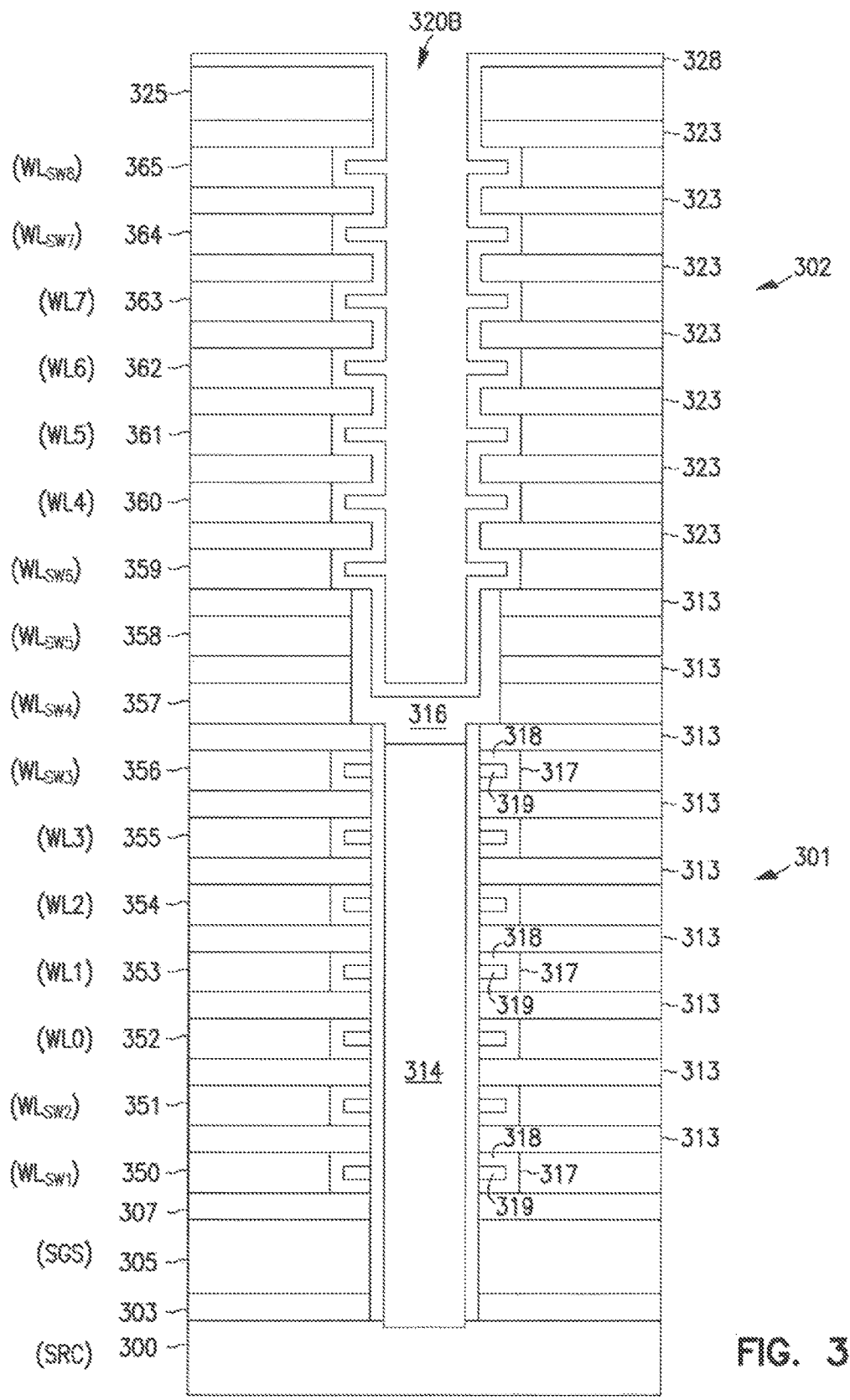
Figure 3L:
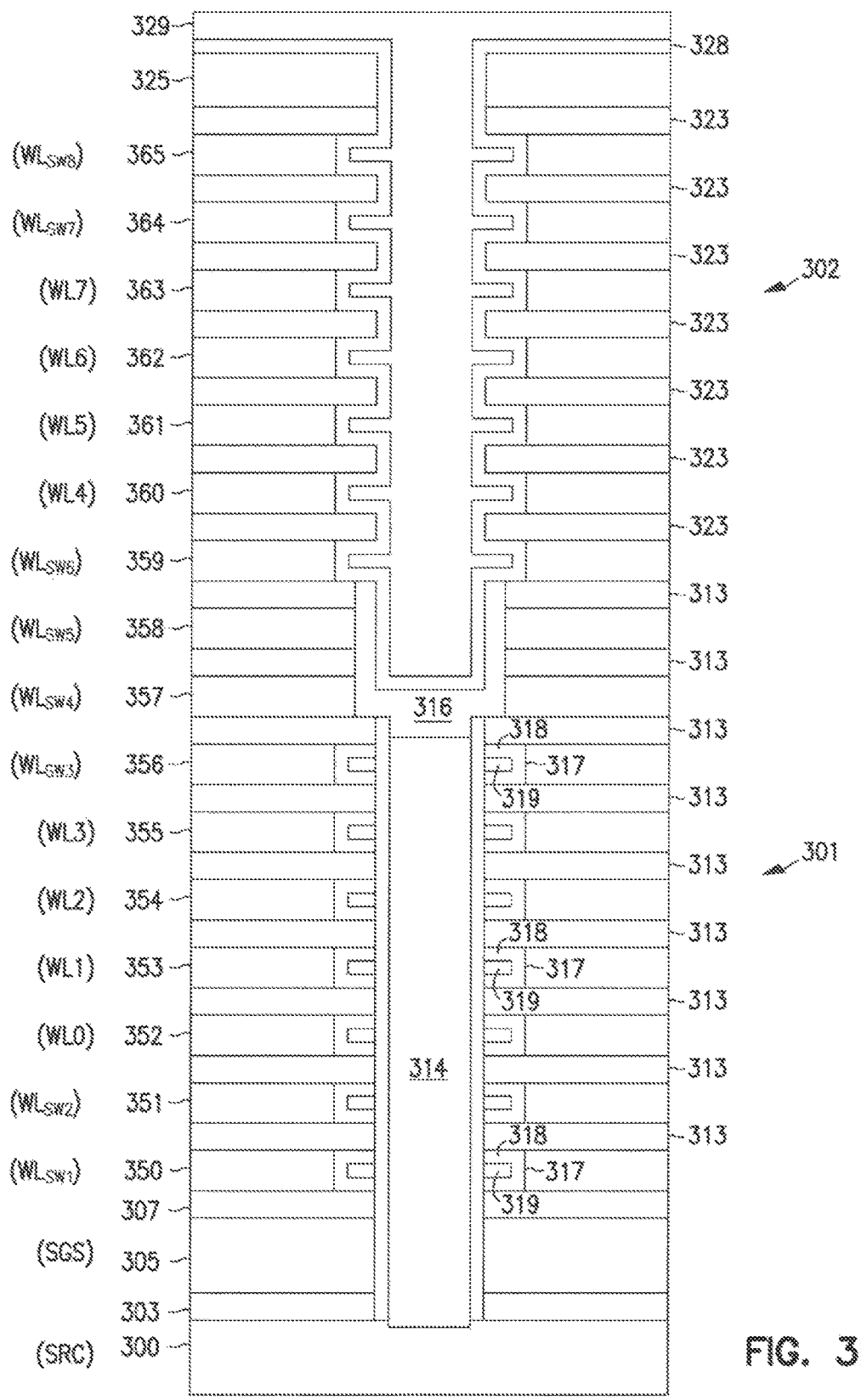
Figure 3M:
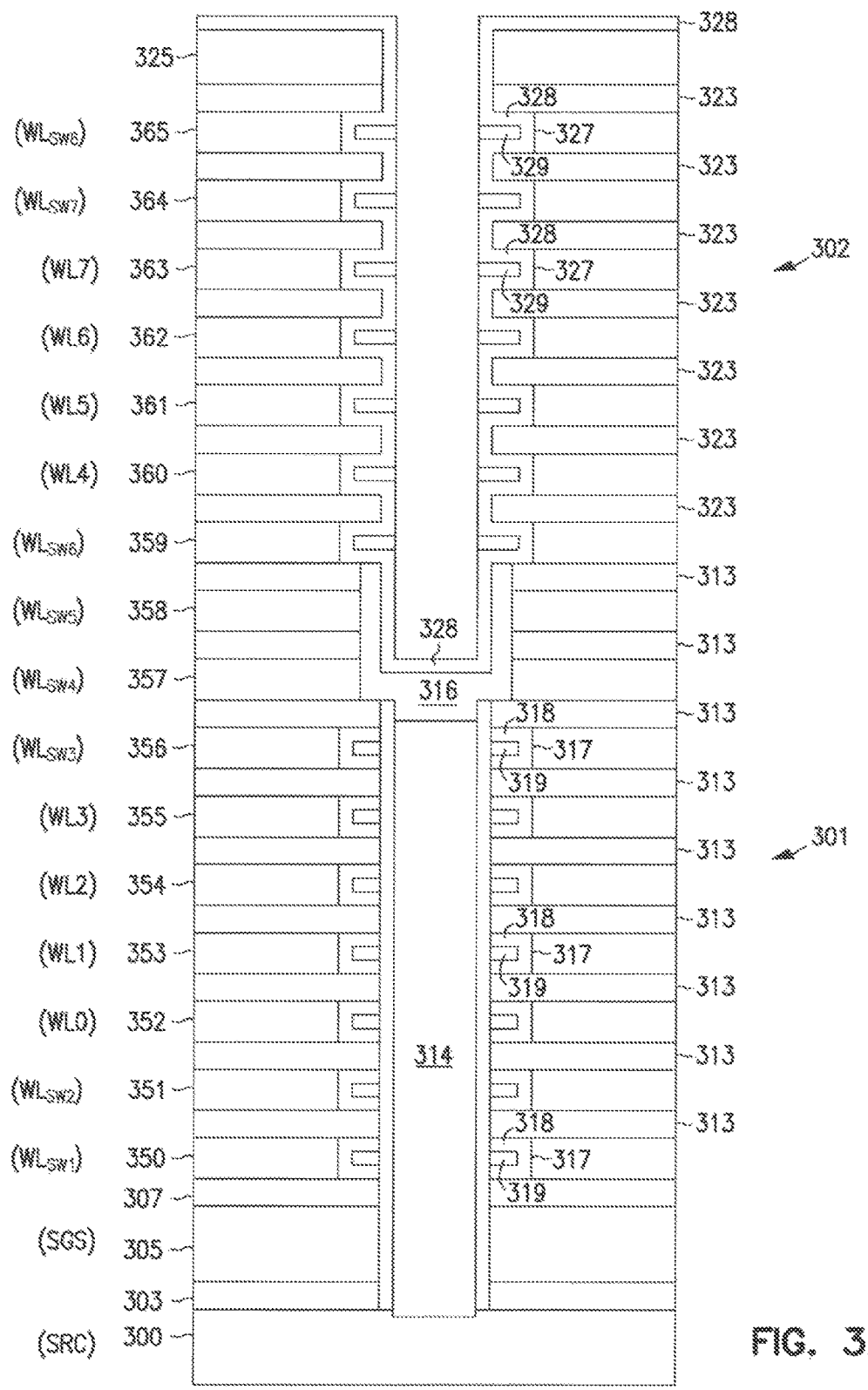
Figure 3N:
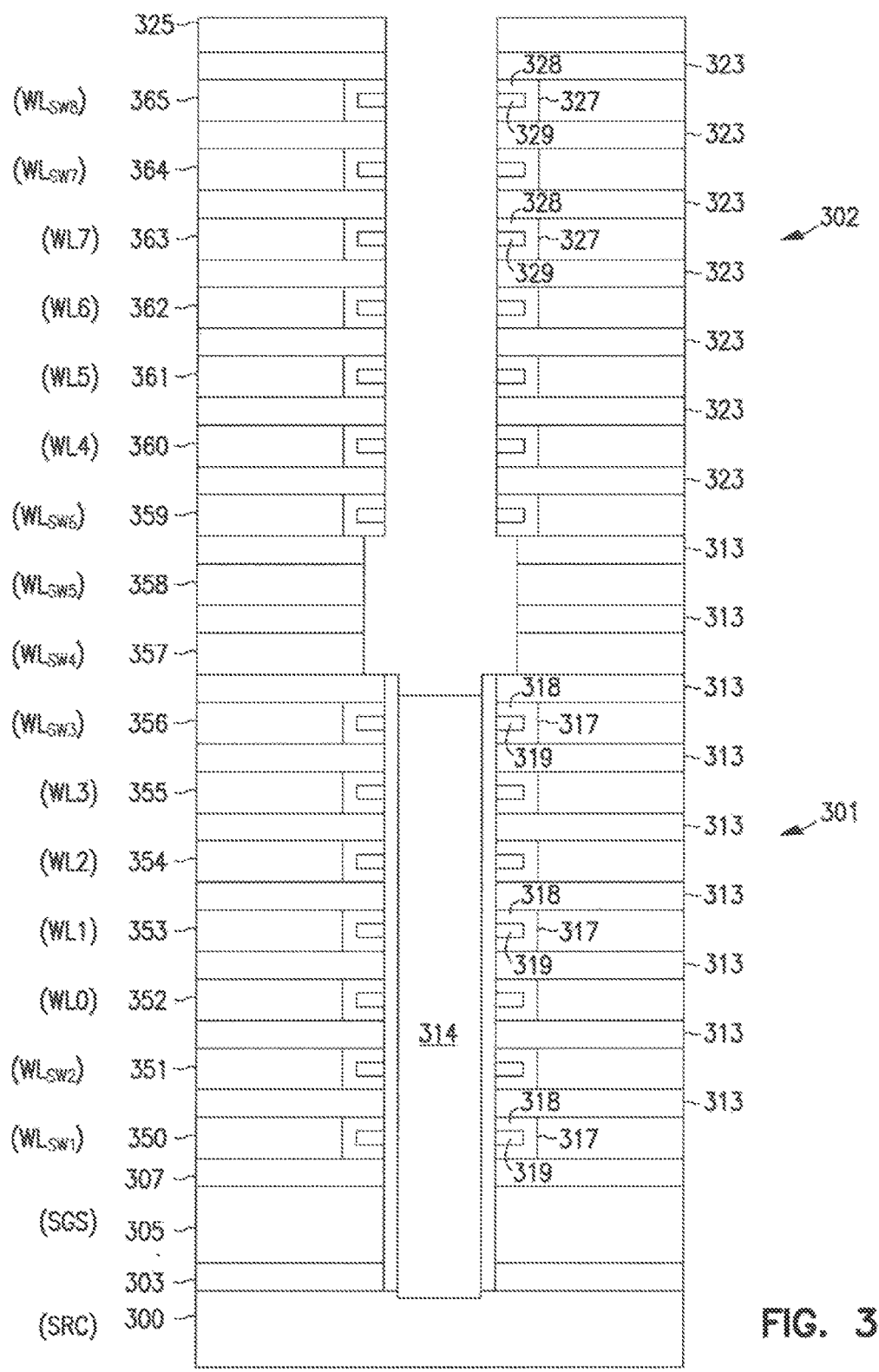
Figure 30:
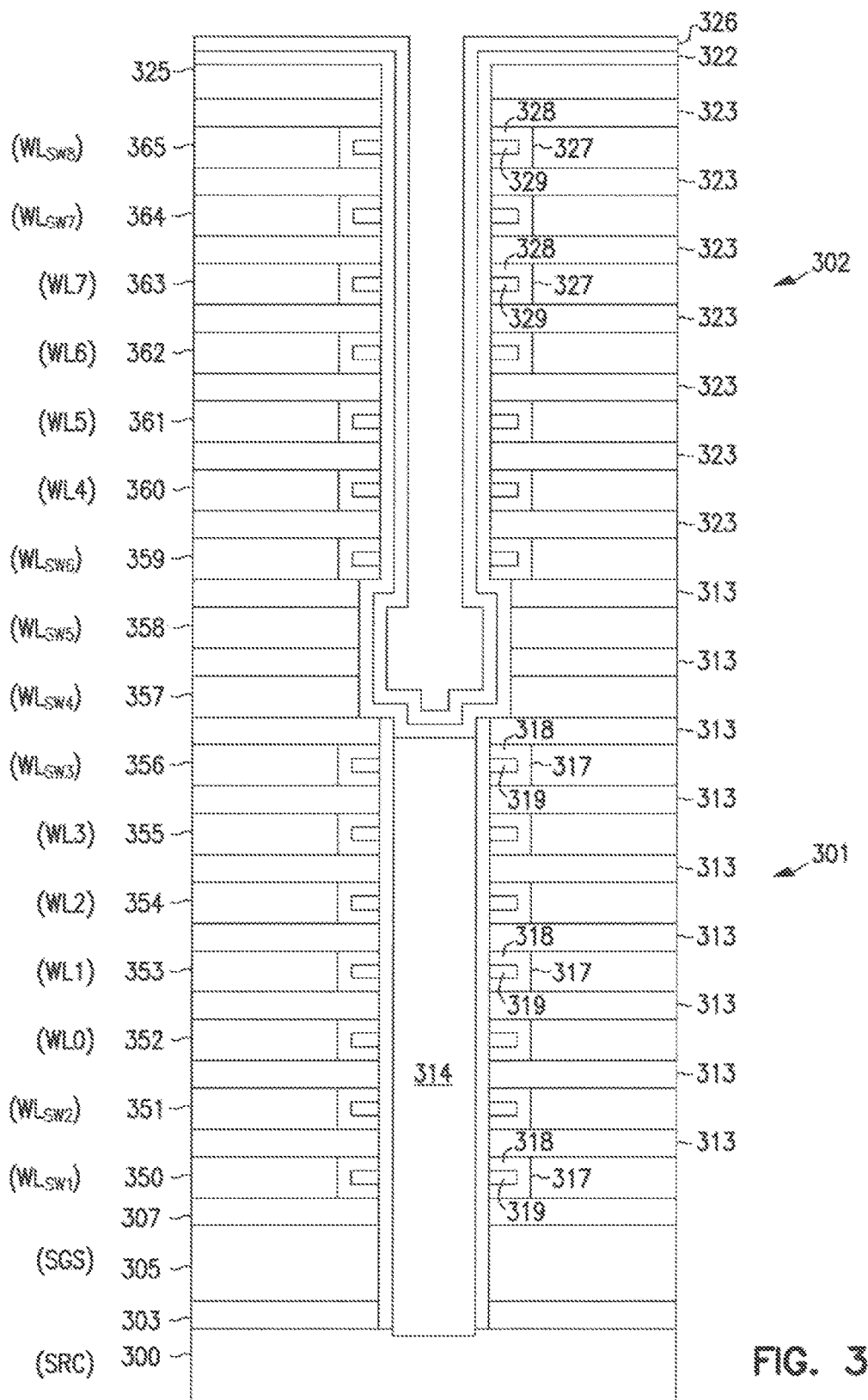
Figure 3P:
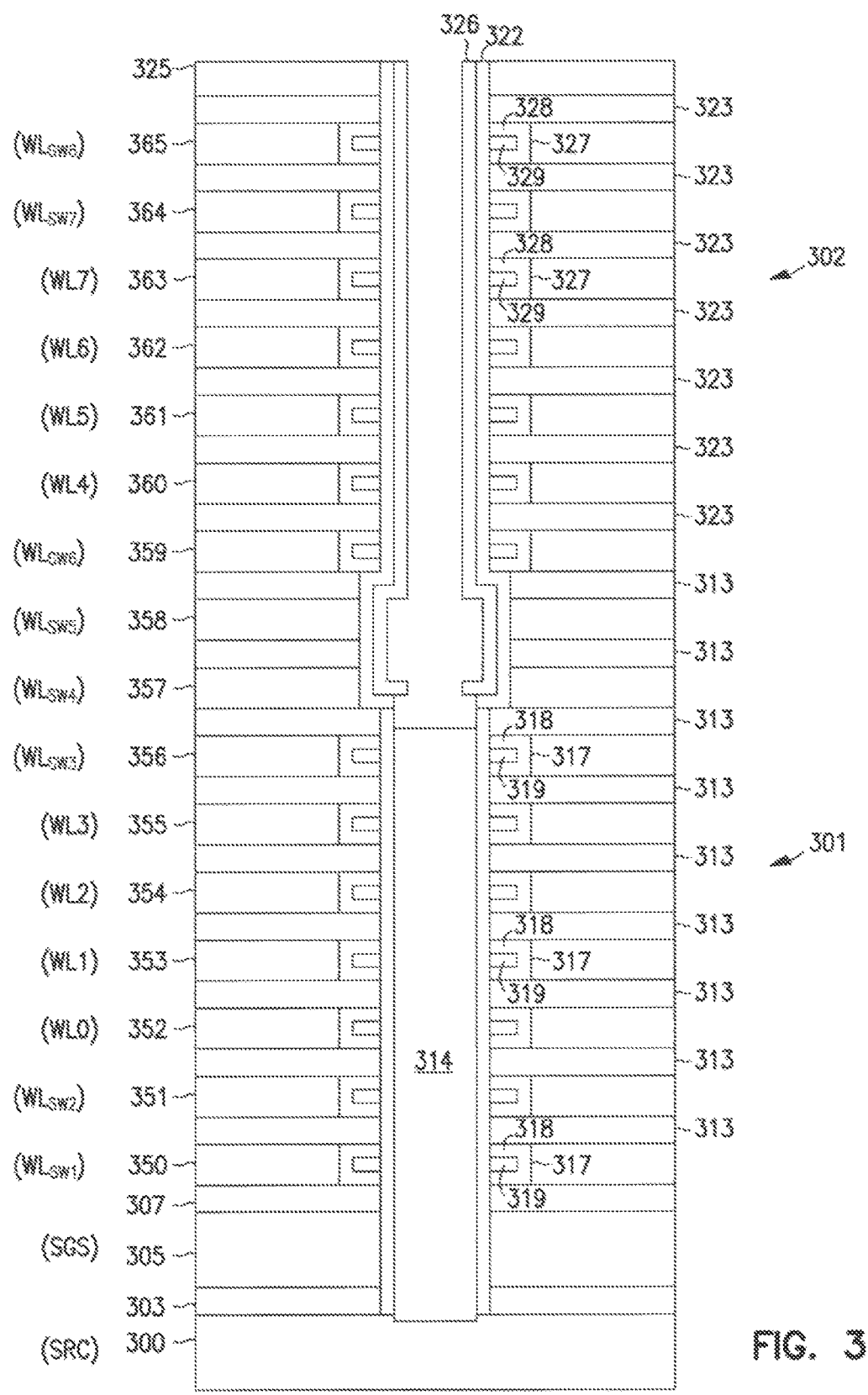
Figure 3Q:
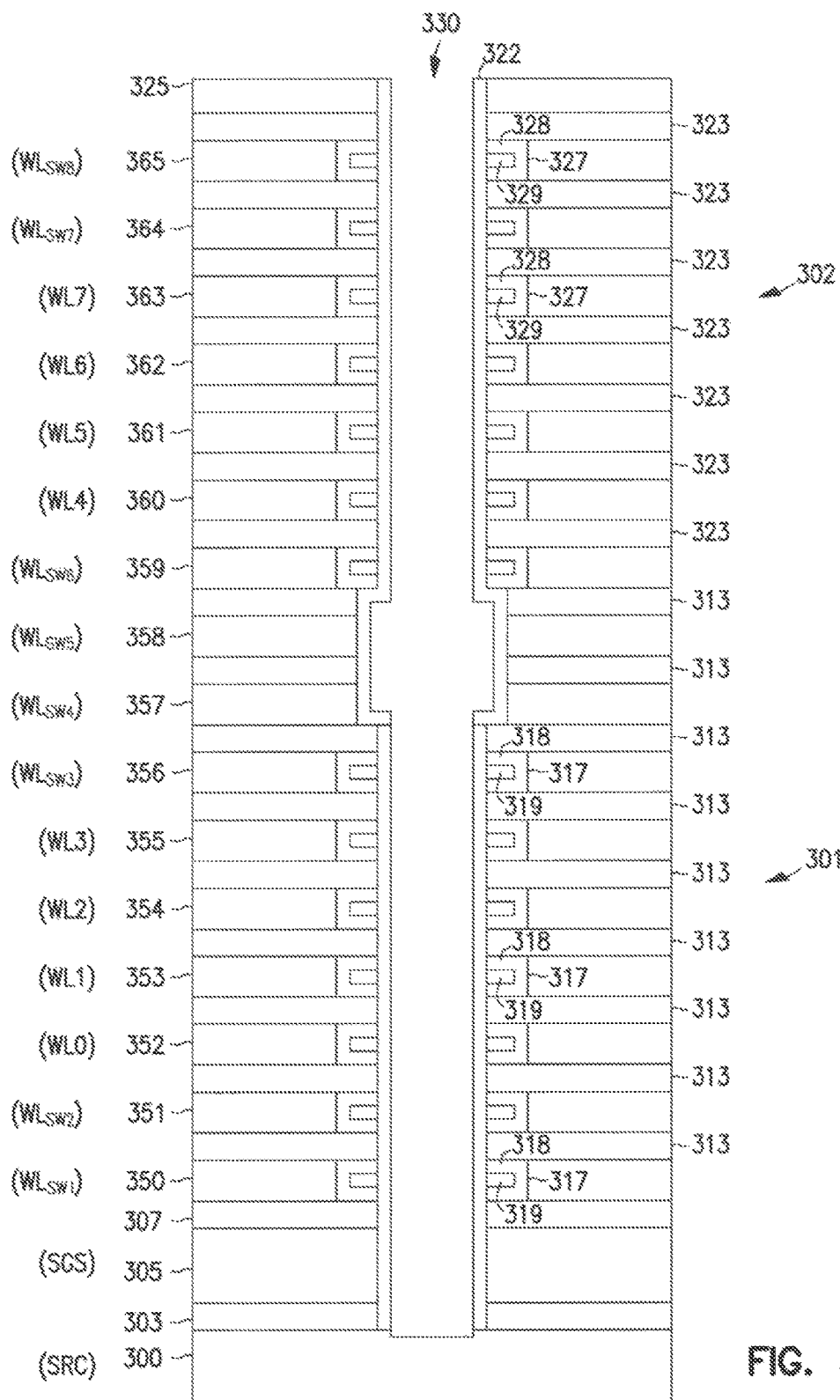
Figure 3R:
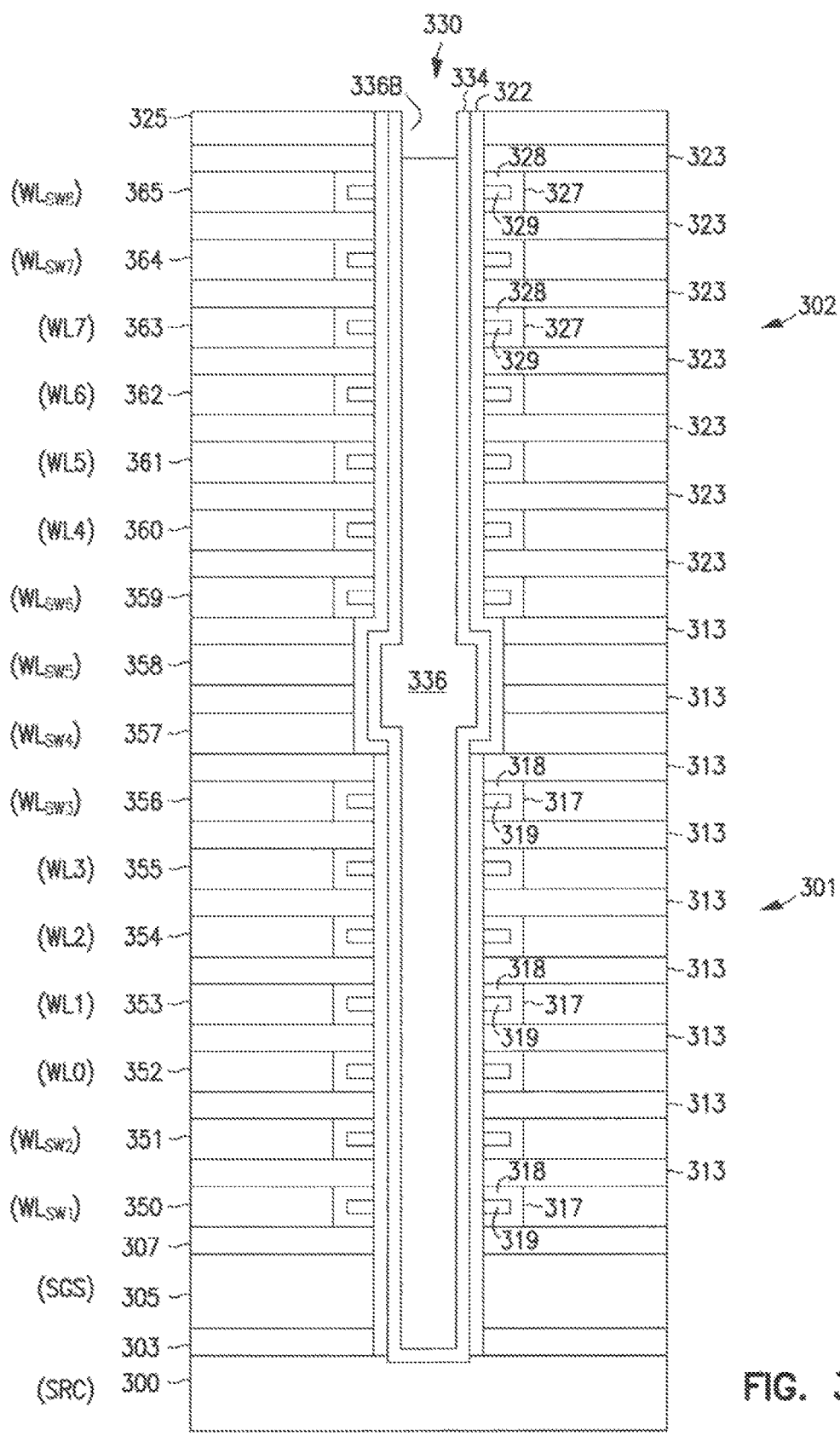
Figure 3S:
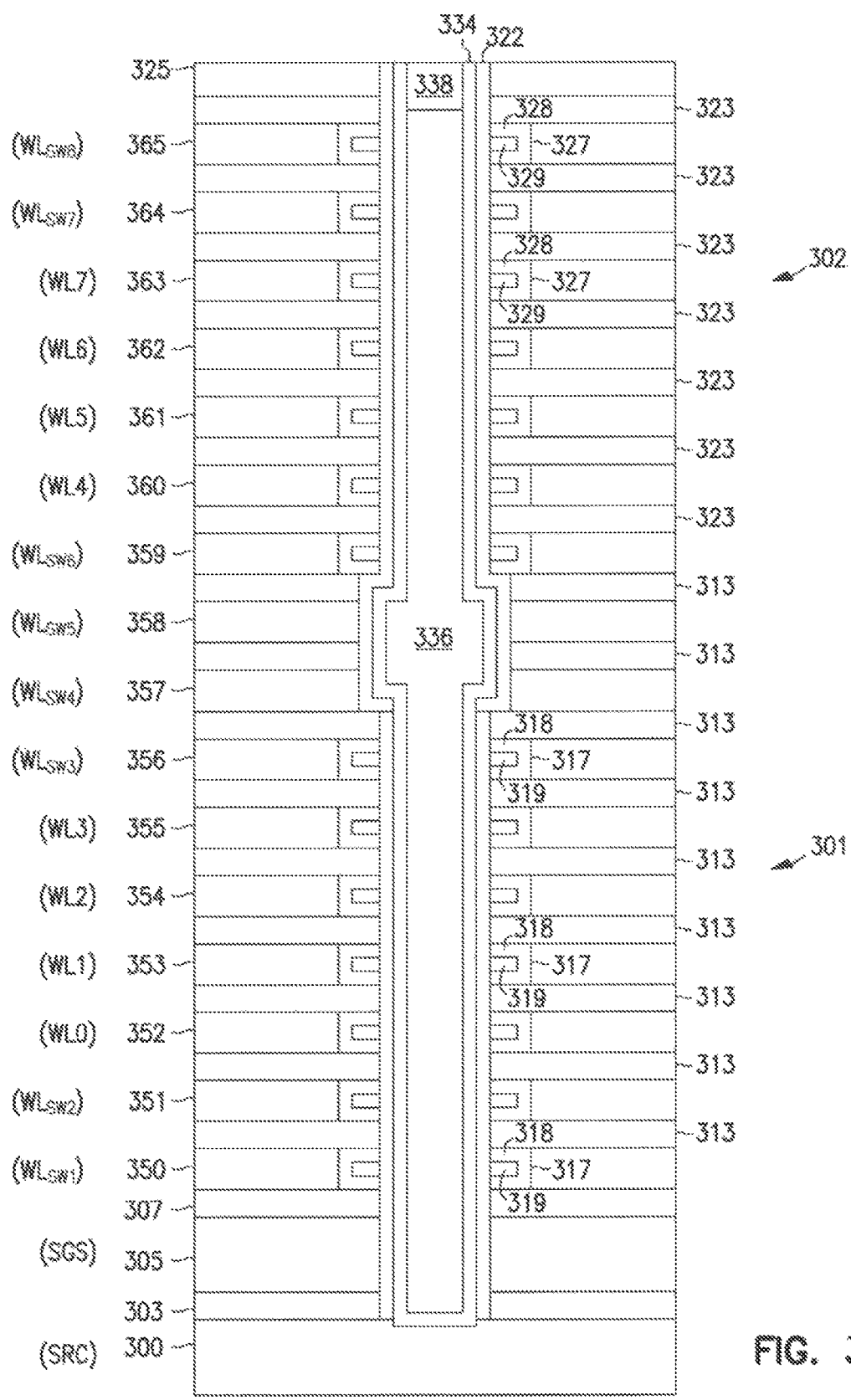

FIG. 3A through FIG. 3S show different portions of fabrication processes of forming a memory device, according to an embodiment of the invention. The processes described below with reference to FIG. 3A through FIG. 3S can be used to form a memory device, such as memory device 100 (FIG. 1) and memory device 200 (FIG. 2A and FIG. 2B). The techniques and fabrication processes described herein can be extended to a number of different apparatuses (e.g., in addition to memory devices) to be fabricated using processes, including, for example, a three-dimensional process. However, fabrication of a NAND memory device will be described below to retain clarity and consistency in the discussions that follow.

FIG. 3A shows a structure of a deck 301 of a memory device (e.g., memory device 100 of FIG. 1 or memory device 200 of FIG. 2A and FIG. 2B). Deck 301 can include a source material 300, a dielectric material 303, a select gate material 305 (e.g., conductively doped polysilicon), and a dielectric material 307.

Deck 301 can be formed by techniques known to those skilled in the art. For example, each of the materials of deck 301 (and other materials described herein) may be applied, deposited, or otherwise formed according to techniques and methods known independently in the art. The techniques and methods can include one or more deposition activities, such as chemical vapor deposition (CVD), atomic level deposition (ALD), physical vapor deposition (PVD), or other techniques known independently in the art. Forming multiple materials in different levels may be accomplished by stacked deposition operations.

Although the process acts and operations described herein may refer to particular conductor, semiconductor, or dielectric materials (such as silicon, an oxide of silicon (e.g., silicon dioxide), silicon nitride, or others), a person of ordinary skill in the art and familiar with this disclosure will recognize that other conductor, semiconductor, and dielectric materials may be substituted and still be within a scope of the disclosed subject matter. Thus, the material choices and selections presented are merely provided as an aid in understanding one example of a fabrication process.

For example, different types of semiconductor materials, such as different elemental and compound semiconductors, may be used as an alternative for or in conjunction with silicon. Additionally, different types of dielectric materials, such as tantalum pentoxide ($Ta_2O_5$), silicon nitride ($Si_xN_y$), aluminum oxide ($Al_2O_3$), hafnium oxide ($HfO_2$), and a variety of other dielectric materials can be used as an alternative to or in conjunction with silicon dioxide or silicon nitride.

In FIG. 3A, source material 300 can be part of a source that can correspond to source 213 of FIG. 2B. Source material 300 in FIG. 3A can include, for example, a conductively doped polysilicon (N+ doped polysilicon) material, a silicide material (e.g., $WSi_2$), or other conductive materials, formed in or on semiconductor substrate. In another example, source material 300 can include a conductively doped region of a semiconductor substrate. In some cases, source material 300 can include a combination of two different levels of materials. For example, source material 300 can include one level of a silicide material (e.g., $WSi_2$) formed on a semiconductor substrate and another level of conductively doped polysilicon (e.g., N+ doped polysilicon) formed on the level of the silicide material.

As referred to herein, a semiconductor substrate can be any of different types of substrates used in the semiconductor and allied industries, such as silicon wafers, compound wafers, thin film head assemblies, and polyethylene-terephthalate (PET) films deposited or otherwise formed with a semiconducting material, as well as numerous other types of substrates known independently in the art, and/or portions thereof. In some cases, in FIG. 3A, source material 300 may be formed over a non-semiconductor material.

Dielectric materials 303 and 307 may include the same material or different materials. For example, dielectric materials 303 and 307 can include silicon dioxide ($SiO_2$). Further, dielectric materials 303 and 307 may be formed from the same material but by different techniques. For example, dielectric material 303 may be a thermally-grown silicon dioxide material and dielectric material 307 may be a deposited silicon dioxide material (or vice versa).

Select gate material 305 can include a conductor material (e.g., conductively doped polysilicon). Select gate material 305 can be part of a select gate (e.g., source-side select gate), such as select gate 205 of FIG. 2B.

As shown in FIG. 3A, deck 301 can also include alternating materials that include conductor materials 350 through 358 and dielectric materials 313. Conductor materials 350 through 358 can include conductively doped polysilicon or a number of other conductor materials. Dielectric materials 313 can include silicon dioxide or a number of other dielectric materials.

Conductor materials 350 through 358 can be part of control gates similar to, or identical to, control gates 250 through 258, respectively, of FIG. 2B. FIG. 3A shows some of the signals associated with control gates 250 through 258 in FIG. 2B (e.g., WL0 through WL3 and $WL_{SW1}$ through $WL_{SW8}$) to indicate that the control gates that include conductor materials 350 through 358 in FIG. 3A can also conduct signals similar to, or identical to, the signals in FIG. 2B.

In FIG. 3A, conductor materials 350 through 356 can include conductively doped polysilicon of the same conductivity type (e.g., n-type) that may be different from the conductivity type of conductively doped polysilicon of conductor materials 357 and 358. For example, conductor materials 350 through 356 can include conductively doped polysilicon of n-type and conductor materials 357 and 358 can conductively doped polysilicon of p-type.

FIG. 3A shows four conductor materials 352 through 355 as an example. The number of conductor materials 352 through 355 can vary, depending on the number of levels of memory cells in deck 301. For example, deck 301 shows four levels of memory cells associated with four corresponding levels of conductor materials 352 through 355. However, if the levels of operational memory cells is N (e.g., an integer), then the number of conductor materials 352 through 355 can also be equal to N.

As shown in FIG. 3A, deck 301 can also include capping material 315 that can include, for example, p-type polysilicon or nitride. As described below, capping material 315 may be removed before forming another deck (e.g., a top deck) over deck 301. In some processes, p-type polysilicon may be easier to remove than nitride. Thus, in some processes, capping material 315 in FIG. 3A may include p-type polysilicon instead of nitride.

Deck 301 can also include a recess 317, inter-polysilicon dielectric (IPD) material 318 (e.g., a charge blocking material) formed on sidewalls of recess 317, and a charge-storage material 319 formed adjacent IPD material 318. IPD material 318 can include one or more dielectric materials, including high-κ dielectric materials. For example, IPD material 318 can include an oxide-nitride-oxide (ONO) material. Charge-storage material 319 can include one or more of the semiconductor materials. For example, charge-storage material 319 can include polysilicon. In another example, charge-storage material 319 can include silicon nitride (e.g., $Si_3N_4$).

Charge-storage material 319 can be a part of a memory cell structure that can be configured to store information. FIG. 3A shows seven memory cell structures (that include seven different charge-storage materials 319) formed on the seven corresponding levels where conductor materials 350 through 356 are located. However, only four of the seven memory cell structures may be configured to operate as memory cells to store information. Three of the seven memory cell structures may not be configured to operate as memory cells to store information but may be configured to operate as switches (e.g., transistors).

For example, four memory cell structures formed on the same levels where conductor materials 352 through 355 are located may be configured to operate as four memory cells to store information. These four memory cells (that can be accessed by four corresponding access lines that include conductor materials 352 through 355) can correspond to memory cells 203 in string 207 that can be accessed by control gates 252 through 255 of FIG. 2B.

In FIG. 3A, three memory cell structures formed on the same levels where conductor materials 350, 351, and 356 are located may be configured to operate as switches. These switches (that can be controlled by access lines that include conductor materials 350, 351, and 365) can correspond to switches 241 in string 207 controlled by control gates 250, 251, and 265.

FIG. 3A does not show memory cell structures formed on the same levels where conductors materials 357 and 358 are located. However, these structures can also be configured to operate as switches (e.g., transistors). These switches can correspond to switches 242 in string 207 controlled by corresponding control gate 257 and 258. In FIG. 3A, the switches (having no memory cell structures) can be controlled by corresponding access lines that include conductor materials 357 and 358.

Deck 301 can also include a hole 310 containing tunneling material 312 and material 314 extending through conductor materials 311 and dielectric materials 313. Hole 310 containing tunneling material 312 and material 314 can be part of a pillar, such as pillar 231 of FIG. 2B. In FIG. 3A, material 314 may include polysilicon. Tunneling material 312 may be formed from a number of dielectric materials that allow for Fowler-Nordheim tunneling of electrons or direct tunneling of holes or other injection mechanisms. For example, tunneling material 312 can include deposited and/or thermally-grown silicon dioxide.

During a process of forming deck 301, hole 310 and materials 312 and 314 can be formed by removing (e.g., by etching) a portion of materials (e.g., 350 through 358, 313, and 315) where hole 310 is located (as shown in FIG. 3A). Then, tunneling material 312 can be formed on sidewalls of hole 310 followed by a formation of material 314 adjacent tunneling material 312.

In FIG. 3B, a portion of material 314 can be removed (e.g., by etching) from a hole portion 310B of hole 310. As shown in FIG. 3B, hole portion 310B may include a recess (e.g., opening) extending from capping material 315 to conductor material 357.

In FIG. 3C, tunneling material 312 at hole portion 310B can be removed (e.g., by wet etching). A portion of dielectric materials 313 at locations adjacent hole portion 310B can also be removed (e.g., by wet etching), such that recesses 313B are formed. Each of recesses 313B can include a vertical sidewall formed by edge 313C of dielectric materials 313. As shown in FIG. 3C, edge 313C can extend laterally from hole portion 310B to a location not beyond the recesses where IPD material 318 and charge-storage material 319 are located. The lateral dimension between edge 313C may create a sufficient critical dimension (CD) of a sacrificial material to be subsequently formed in hole portion 310B, as described below.

In FIG. 3D, the size of hole portion 310B can be enlarged to form an enlarged hole portion 310C. Forming enlarged hole portion 310C can include selectively removing a portion of capping material 315 at locations adjacent hole portion 310B (FIG. 3C) and a portion of conductor materials 357 and 358 at locations adjacent hole portion 310B (FIG. 3C). A dry etch or wet etch (e.g., using tetramethyl ammonium hydroxide (TMAH)) may be used to remove a portion of capping material 315 and a portion of conductor materials 357 and 358. In FIG. 3D, the amount of capping material 315 and conductor materials 357 and 358 that is removed can be dependent on the amount of dielectric material 313 (adjacent hole portion 310B) that was removed in the process shown in FIG. 3C. For example, as shown in FIG. 3D, portions of capping material 315 and conductor materials 357 and 358 can be removed selective to edge 313C.

Enlarged hole portion 310C can have a diameter 310D that is greater than a diameter 310E (e.g., a diameter of an un-enlarged portion of hole 310). The value of diameter 310D can be selected based on a value of an alignment margin for forming a channel (in an additional deck) directly over enlarged hole portion 310C. In some processes, as an example, diameter 310D can be approximately 12 to 15 nanometers greater than diameter 310E.

Forming enlarged hole portion 310B described above with reference to FIG. 3D may improve the process (e.g., a deck-by-deck process) of forming a channel (e.g., a multi-deck channel as described below) that extends through multiple decks including a deck that is formed over deck 301. For example, in comparison with an un-enlarged hole, enlarged hole portion 310B may allow for selecting a value of an alignment margin to satisfy a critical dimension value for building an additional hole (in an additional deck) directly aligned over hole 310.

In FIG. 3E, a sacrificial material 316 is formed in enlarged hole portion 310C. Sacrificial material 316 may allow a process (e.g., a dry etch) associated with forming a pillar (e.g., pillar 231 of FIG. 2B) between deck 301 and an additional deck (formed over deck 301) to be efficiently performed. For example, forming sacrificial material 316 as described herein may help forming a relatively straight pillar (e.g., pillar 207 in FIG. 2B) profile and allow the process (e.g., dry etch) to stop uniformly.

In FIG. 3E, after sacrificial material 316 is formed, a flattening process (e.g., chemical-mechanical polishing (CMP) process) may be performed to flatten (e.g., to planarize) sacrificial material 316 such that its top surface may be co-planar with the top surface of capping material 315. In an alternative process, the flattening process (e.g., CMP process) associated with FIG. 3E may be skipped.

Sacrificial material 316 in FIG. 3E will be removed in a subsequent process, as described below. Thus, sacrificial material 316 can include a material that can be selectively removable (e.g., by wet chemistry over polysilicon, nitride, and oxide). As an example, sacrificial material 316 can include aluminum oxide ($Al_2O_3$).

In FIG. 3F, a portion of sacrificial material 316 can be removed. For example, hydrofluoric acid (HF) can be used to remove a portion of sacrificial material 316 adjacent material 315.

In FIG. 3G, capping material 315 (shown in FIG. 3F) can be removed (e.g., by selective dry etch, wet etch, or CMP). In an alternative process, the processes associated with FIG. 3F and FIG. 3G can be combined such that a portion of sacrificial material 316 (that was removed in FIG. 3F) and capping material 315 (FIG. 6F) can be removed in a single step (e.g., using TMAH). In FIG. 3G, after capping material 315 is removed, a flattening process (e.g., CMP) may be performed to improve planarity of deck 301 before an additional deck is formed over deck 301.

In FIG. 3H, a process of forming a deck 302 can start. Forming deck 302 can include forming alternating conductor materials 359 through 365 and dielectric materials 323, and capping material 325 over the first deck 301. Deck 302 can be formed by techniques known to those skilled in the art. For example, each of the materials of deck 302 (and other materials described herein) may be applied, deposited, or otherwise formed according to techniques and methods known independently in the art. The techniques and methods can include one or more deposition activities, such as CVD, ALD, PVD, or other techniques known independently in the art. Forming multiple materials in different levels may be accomplished by stacked deposition operations.

In FIG. 3H, conductor materials 359 through 365 can include conductively doped polysilicon of the same conductivity type (e.g., n-type). Capping material 325 can have the same material as or different materials from that of capping material 315 (FIG. 3A). Examples of materials for capping material 325 include p-type polysilicon or nitride.

Conductor materials 359 through 365 can be part of control gates similar to, or identical to, control gates 259 through 265, respectively of FIG. 2B. FIG. 3H shows some of the signals associated with control gates 259 through 265 in FIG. 2B (e.g., WL4 through WL7 and $WL_{SW6}$ through $WL_{SW8}$) to indicate that the control gates that include conductors 359 through 365 in FIG. 3H can also conduct signals similar to, or identical to, the signals in FIG. 2B.

FIG. 3H shows seven conductor materials 359 through 365 in deck 302 as an example. The number of conductor materials in deck 302 can vary, depending on the number of levels of memory cells in deck 302.

In FIG. 3I, a hole 320 can be formed through conductor materials 359 through 365, dielectric materials 323, and capping material 325 in deck 302. Hole 320 can have a diameter 320E less than diameter 310D (which is the diameter of enlarged hole portion 310C (FIG. 3D)). The process of forming hole 320 in FIG. 3I can be similar to the process of forming hole 310 (FIG. 3A). Thus, diameter 320E of hole 320 (FIG. 3I) can be equal to diameter 310E (FIG. 3D) of hole 310.

In FIG. 3I, forming hole 320 can include removing (e.g., by etching) a portion of conductor materials 359 through 365, dielectric materials 323, and capping material 325 (stopping at sacrificial material 316). Forming hole 320 may also include removing a portion of sacrificial material 316. After hole 320 is formed, at least a portion of the sacrificial material 316 may be exposed through hole 320, as shown in FIG. 3I.

In FIG. 3J, a recessed hole 320B can be formed. Forming recessed hole 320B can including removing portions of conductor materials 359 through 365 (e.g., by using an isotropic etch), such that portions conductor materials 359 through 365 can be recessed (e.g., laterally removed from the sidewalls of hole 320 in FIG. 3I) to form recesses 327. Etchant such as TMAH (or other etchant) may be used to form recessed hole 320B.

In FIG. 3K, an IPD material 328 can be formed on the sidewalls of recessed hole 320B. The material of IDP material 328 can be similar to, or identical to, the material (e.g., ONO) of IDP material 318 of FIG. 3A.

In FIG. 3L, a charge-storage material 329 can be formed adjacent to IPD material 328 in recessed holed 320B. The material of charge-storage 329 can be similar to, or identical to, the material (e.g., polysilicon or nitride) of charge-storage material 319 of FIG. 3A.

In FIG. 3M, a portion of charge-storage material 329 can be removed, leaving other portions of charge-storage material remaining in recesses 327. In order to avoid damage to the portion (e.g., the bottom) of IDP material 328 adjacent sacrificial material 316, a combination of dry etch and wet etch may be used during the removal of the portion of charge-storage material 329.

Charge-storage material 329 can be a part of a memory cell structure that can be configured to store information. FIG. 3M shows seven memory cell structures (that include seven different charge-storage materials 329) formed on the seven corresponding levels where conductor materials 359 through 365 are located. However, only four of the seven memory cell structures may be configured to operate as memory cells to store information. Three of the seven memory cell structures may not be configured to operate as memory cells to store information but may be configured to operate as switches (e.g., transistors).

For example, four memory cell structures formed on the same levels where conductor materials 360 through 363 are located may be configured to operate as four memory cells to store information. These four memory cells (that can be accessed by four corresponding access lines that include conductor materials 360 through 363) can correspond to memory cells 203 in string 207 that can be accessed by control gates 260 through 263 of FIG. 2B.

In FIG. 3M, three memory cell structures formed on the same levels where conductor materials 359, 364, and 365 are located may be configured to operate as switches. These switches (that can be controlled by access lines that include conductor materials 359, 364, and 365) can correspond to switches 241 in string 207 controlled by control gates 259, 264, and 265.

In FIG. 3N, a portion of IDP material 328 that is outside recesses 327 can be removed. Sacrificial material 316 can also be removed. The process of removing the portion of IDP 328 and sacrificial material 316 may cause capping material 325 to get thinner.

In FIG. 3O, tunneling material 322 is formed. Sacrificial liner 326 is also formed on tunneling material 322. Sacrificial liner 326 may protect tunneling material 322 from a subsequent punch-etch process. An example material for sacrificial liner 326 includes polysilicon.

In FIG. 3P, portions of sacrificial liner 326 and tunneling material 322 on top of capping material 325, a portion (e.g., the bottom) of sacrificial liner 326, and a portion (e.g., the bottom) of tunneling material 322 can be removed (e.g., by a punch-etch and wet oxide removal process). This process exposes a portion of material 314.

In FIG. 3Q, the remaining portion of sacrificial liner 326 (that was not removed in FIG. 3P) and material 314 can be removed, thereby forming a hole 330 that extends through deck 302 and 301. TMAH chemistry can be used to remove the remaining portion of sacrificial liner 326 and material 314 if source material 300 is a single level of silicide material (e.g., WSi$_2$). As described above with reference to FIG. 3A, in some cases, source material 300 can include a level of a silicide material (e.g., WSi$_2$) formed on a semiconductor substrate and another level of conductively doped polysilicon (e.g., N+ doped polysilicon) formed on the level of the silicide material. In such cases, an additional sacrificial liner may be formed and then an additional punch-etch can be performed to remove the additional sacrificial liner to expose source material 300 (e.g., expose the N+ doped polysilicon buffer layer).

In FIG. 3R, a channel material 334 can be formed adjacent tunneling material 322 (e.g., silicon dioxide) in hole 330 and contacting source material 300. Channel material 334 can include conductively doped polysilicon material. A dielectric material 336 can also be formed (e.g., filled) in hole 330, such that dielectric material 336 is surrounded by channel material 334. An etch (e.g., wet etch) process can be performed to recess the top of dielectric material 336 to form a recess 336B.

In FIG. 3S, a conductor material 338 (e.g., conductively doped polysilicon, such as N+ doped polysilicon) can be formed to fill recess 336B. A CMP process may be performed to flatten conductor material 338, such that it can be co-planar with capping material 325.

As shown in FIG. 3S, the channel formed by channel material 334 is a hollow (e.g., not solid) multi-deck channel, such that channel material 334 does not fill hole 303 but is formed on the sidewalls and bottom of hole 330. In an alternative structure, however, channel material 334 can fill hole 330 and dielectric material 336 can be omitted, such that the channel formed by channel material 334 is solid multi-deck channel.

In FIG. 3S, hole 330 containing tunneling material 312, channel material 334, and materials 336 and 338 can part of a pillar (e.g., pillar 231 of FIG. 2B). Channel material 334 can be part of a channel (e.g., a single multi-deck channel) in such a pillar (e.g., pillar 231 of FIG. 2B) to conduct current between a source (that includes source material 300) and a data line (e.g., data line 270 of FIG. 2B).

Further processes can be performed to complete a memory device that includes multiple decks (e.g., deck 301 and 302) of memory cells.

The processes described above with reference to FIG. 3A through FIG. 3S, and other similar processes described below, may efficiently be performed in order to increase the number of memory cell levels in a memory device and still maintain proper operation of the memory device.

FIG. 4A through FIG. 4D show different portions of fabrication processes of forming a memory device, according to an embodiment of the invention. Some of the processes described below with reference to FIG. 4A through FIG. 4D can be similar to, or identical to, the processes described above with reference to FIG. 3A through FIG. 3S. Thus, similar or identical features or materials between FIG. 3A through FIG. 3S and FIG. 4A through FIG. 4D are not repeated in the description associated with FIG. 4A through FIG. 4D.

In some cases, instead of forming a single channel (e.g., single hollow channel formed by channel material 334 in FIG. 3R), the processes described below with reference to FIG. 4A through FIG. 4D may be used to form a double hollow channel with solid conductive plug (e.g., polysilicon plug) between the double hollow channel.

Figure 4A:
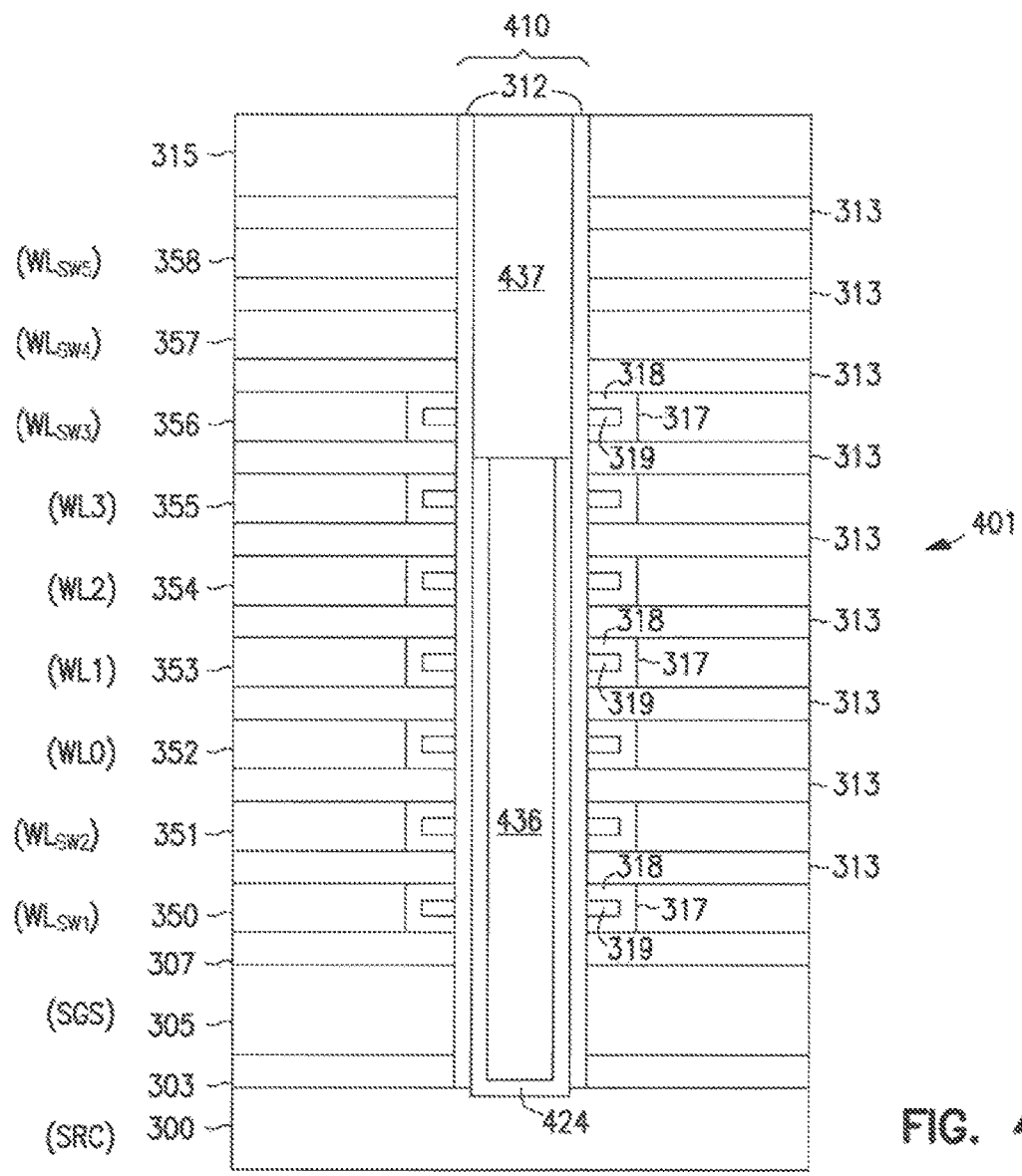
FIG. 4A through FIG. 4D show different portions of fabrication processes of forming a memory device with a double channel, according to an embodiment of the invention.

In FIG. 4A, deck 401 can include a hole 410 extending through materials that include conductor materials 350 through 358, dielectric materials 313, and capping material 315. Hole 410 can contain tunneling material 312 on its sidewalls. At a portion of hole 410 (e.g., portion from source material 300 to approximately dielectric material 313 between conductor materials 355 and 356), a channel material 424 is formed adjacent tunneling material 312 and source material 300. A dielectric material 436 is also formed in hole 410 and is surrounded by channel material 424. A material 437 can be formed adjacent tunneling material 312 in another portion of hole 410 (e.g., portion from capping material 315 to approximately dielectric material 313 between conductor materials 355 and 356). Material 437 can include polysilicon (e.g., conductively doped polysilicon).

Figure 4B:
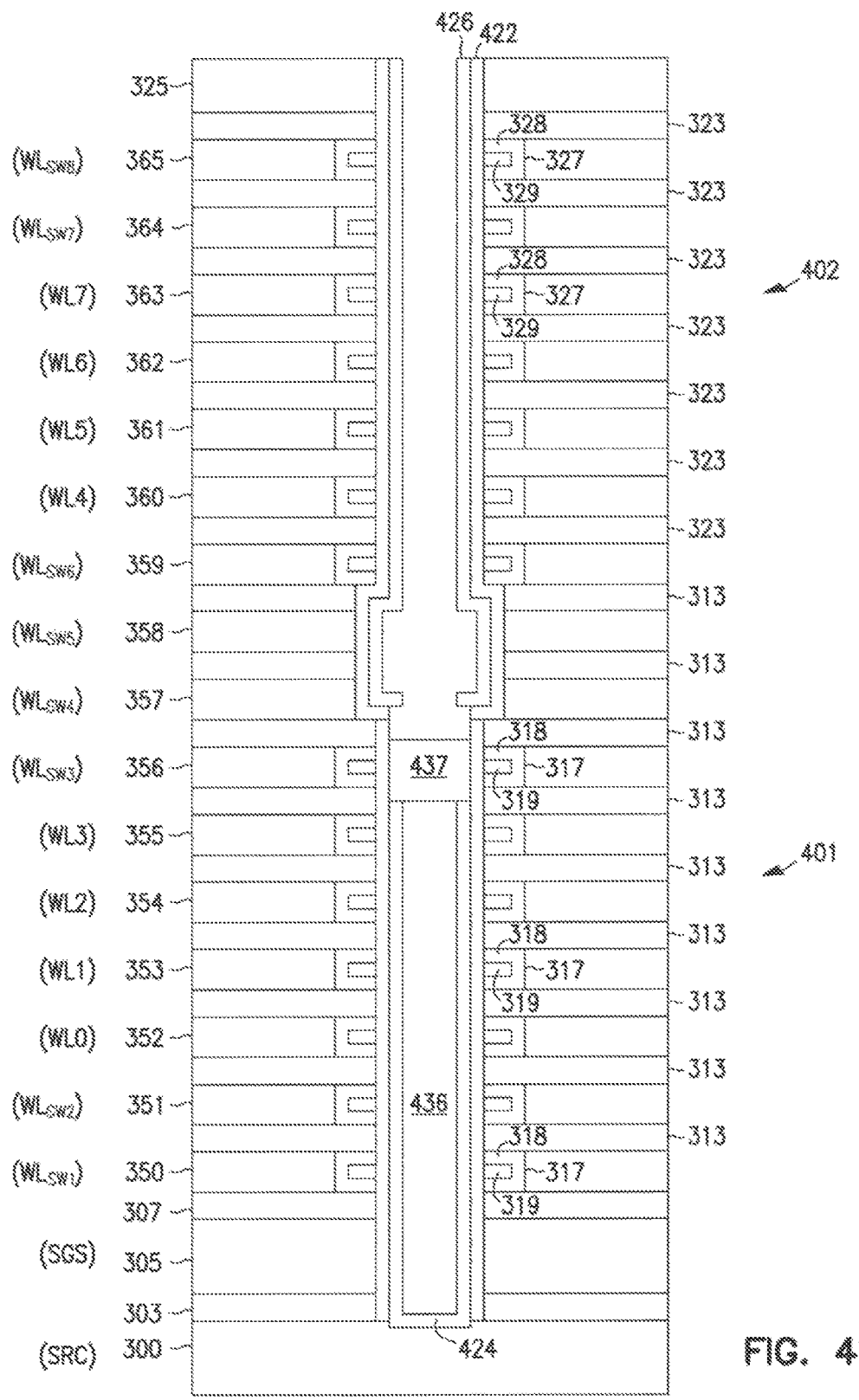

In FIG. 4B, using the processes similar to that described above with reference to FIG. 3A through FIG. 3P, tunneling material 422 and sacrificial liner 426 can be formed. Tunneling material 422 and sacrificial liner 426 can be similar to tunneling material 322 and sacrificial liner 326 of FIG. 3P.

Figure 4C:
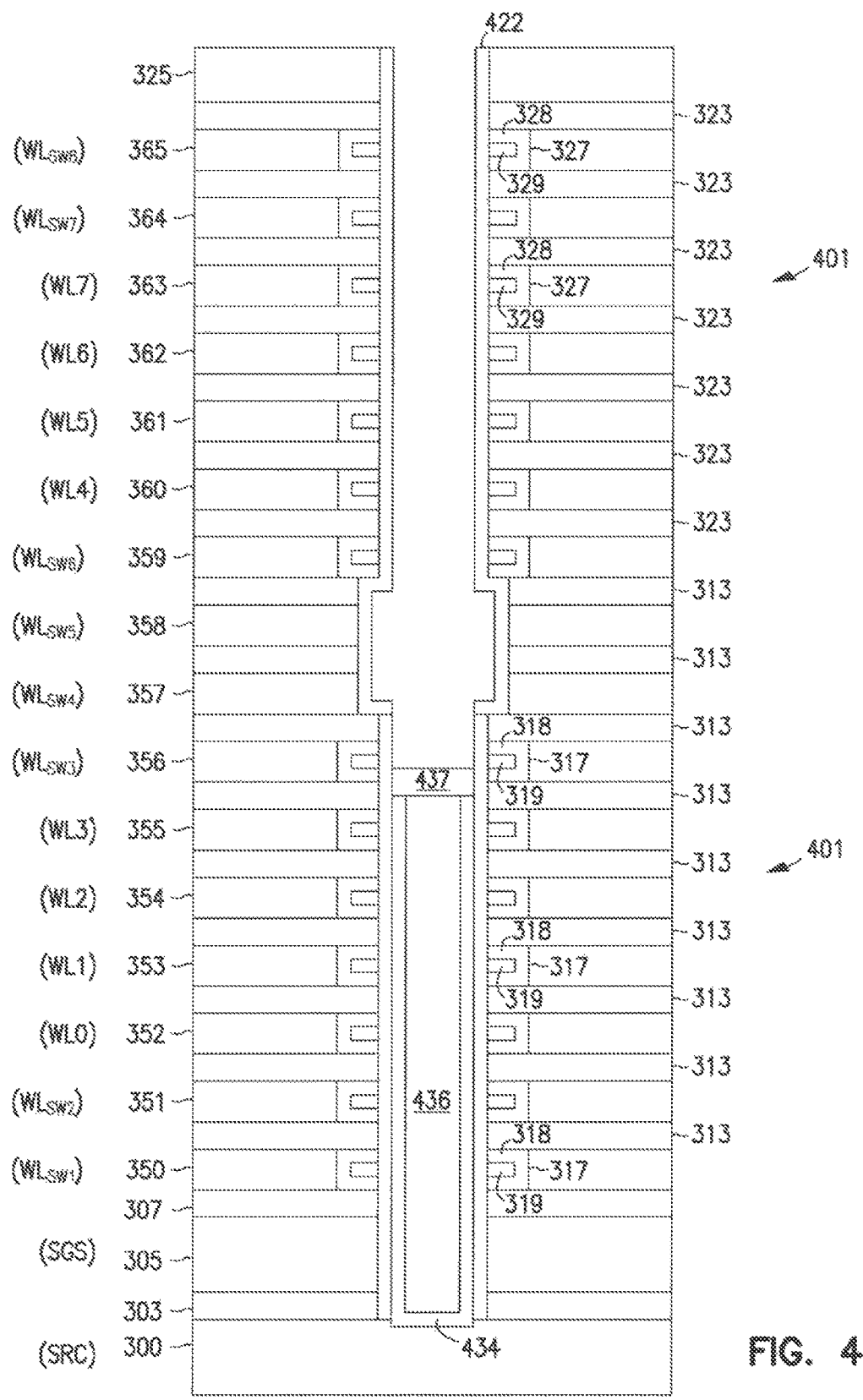

In FIG. 4C, sacrificial liner 426 can be removed (e.g., by using TMAH in liner strip process). A portion of material 437 can also be removed. Thus, the thickness of material 437 (e.g., height) is reduced.

Figure 4D:
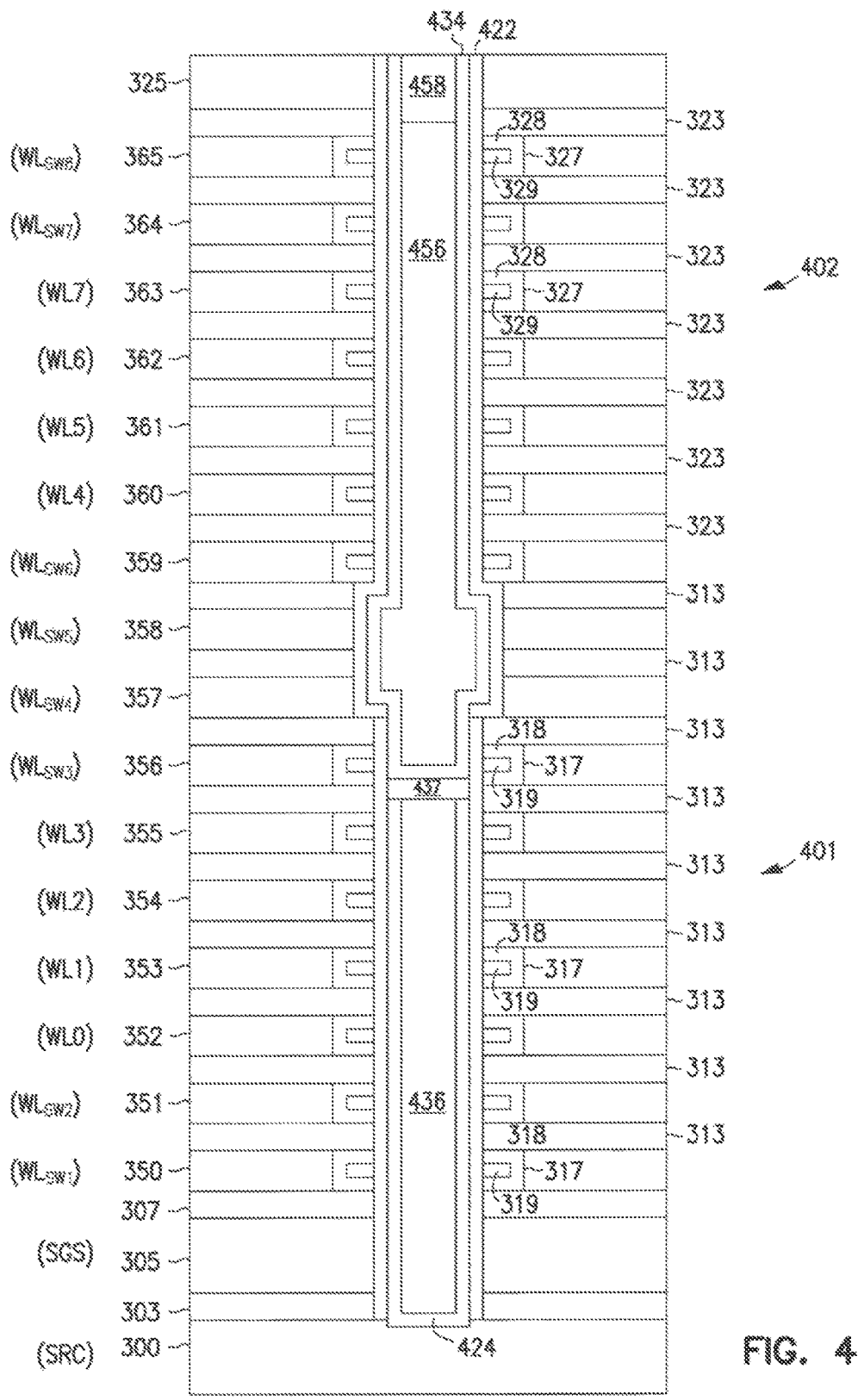

In FIG. 4D, using the processes similar to that described above with reference to FIG. 3R and FIG. 3S, channel material 434, dielectric material 456, and material 458 can be formed. Materials 434, 456, and 458 can include materials similar to, identical to, that of materials 334, 336, and 338, respectively, of FIG. 3S.

In FIG. 4D, channel materials 424 and 434 contact each other and can be part of a double hollow channel included in decks 401 and 402.

FIG. 5A through FIG. 5F show different portions of fabrication processes of forming a memory device, according to an embodiment of the invention. Some of the processes described below with reference to FIG. 5A through FIG. 5F can be similar to, or identical to, the processes described above with reference to FIG. 3A through FIG. 3S.

Thus, similar or identical features or materials between FIG. 3A through FIGS. 3S and 5A through FIG. 5F are not repeated in the description associated with FIG. 5A through FIG. 5F.

The processes described below with reference to FIG. 5A through FIG. 5F may be simpler than the processes described above with reference to FIG. 3A through FIG. 3S. However, the processes associated with FIG. 5A through FIG. 5F may provide an alignment margin that is smaller than that of the processes associated with FIG. 3A through FIG. 3S.

Figure 5A:
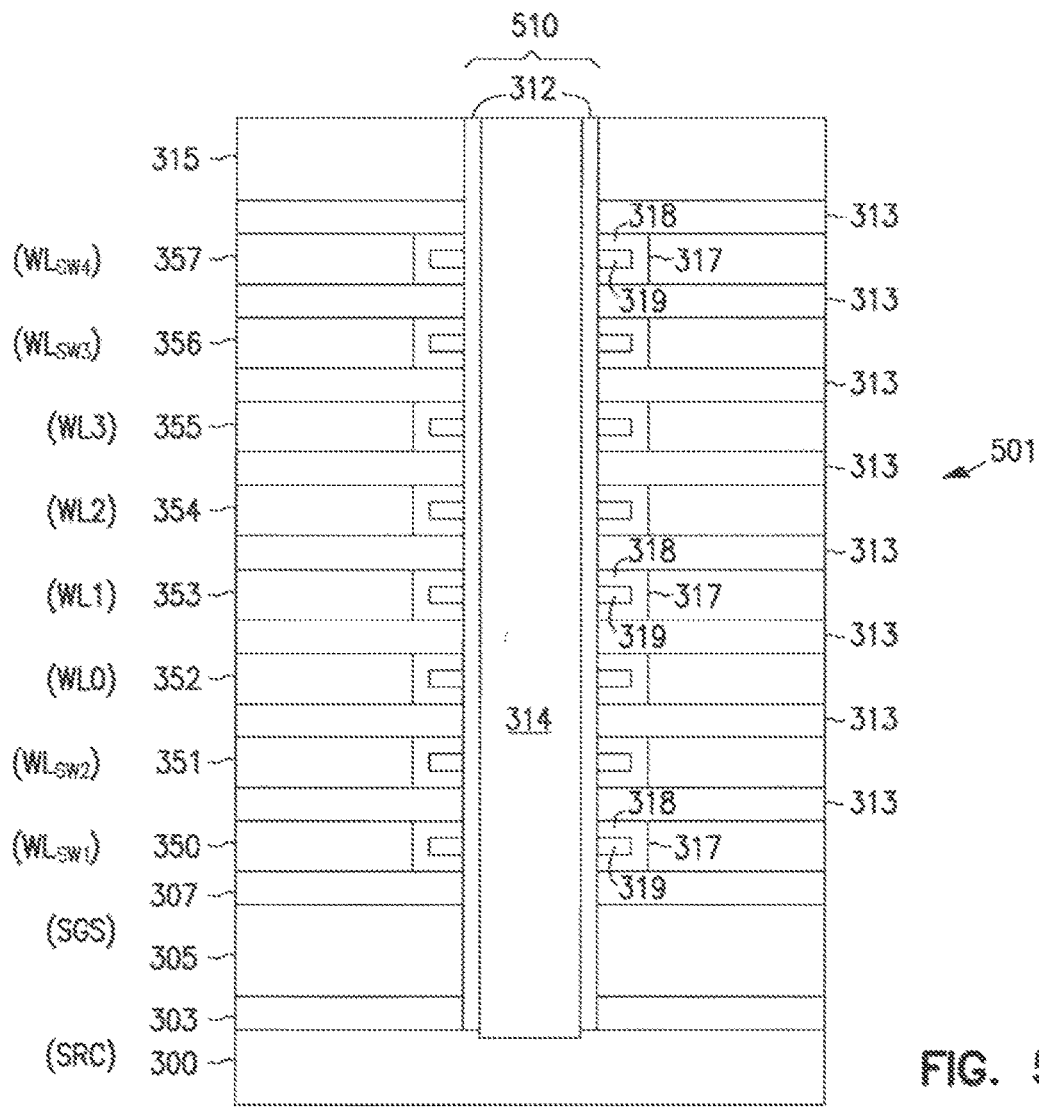
FIG. 5A through FIG. 5F show different portions of another fabrication processes of forming a memory device, according to an embodiment of the invention.

In FIG. 5A, deck 501 can include structures and materials similar to, or identical to, that of deck 301 of FIG. 3A. In FIG. 5A, the level where conductor material 357 is located can include a memory cell structure. However, this memory cell structure may not be configured to store information. It may be configured to operate as a switch. This is similar to the memory cell structure associated with conductor material 356 that may also be configured to operate as a switch. In deck 501 of FIG. 5A, conductor material 358 (shown in FIG. 3A) is omitted. However, conductor material 358 may also be included in deck 501 and can have a memory cell structure configured to operate as a switch.

As shown in FIG. 5A, deck 501 can include a hole 510 extending through materials that include conductor materials 350 through 357, dielectric materials 313, and capping material 315. Hole 510 can contain tunneling material 312 on its sidewalls and material 314 adjacent tunneling material 312.

Figure 5B:
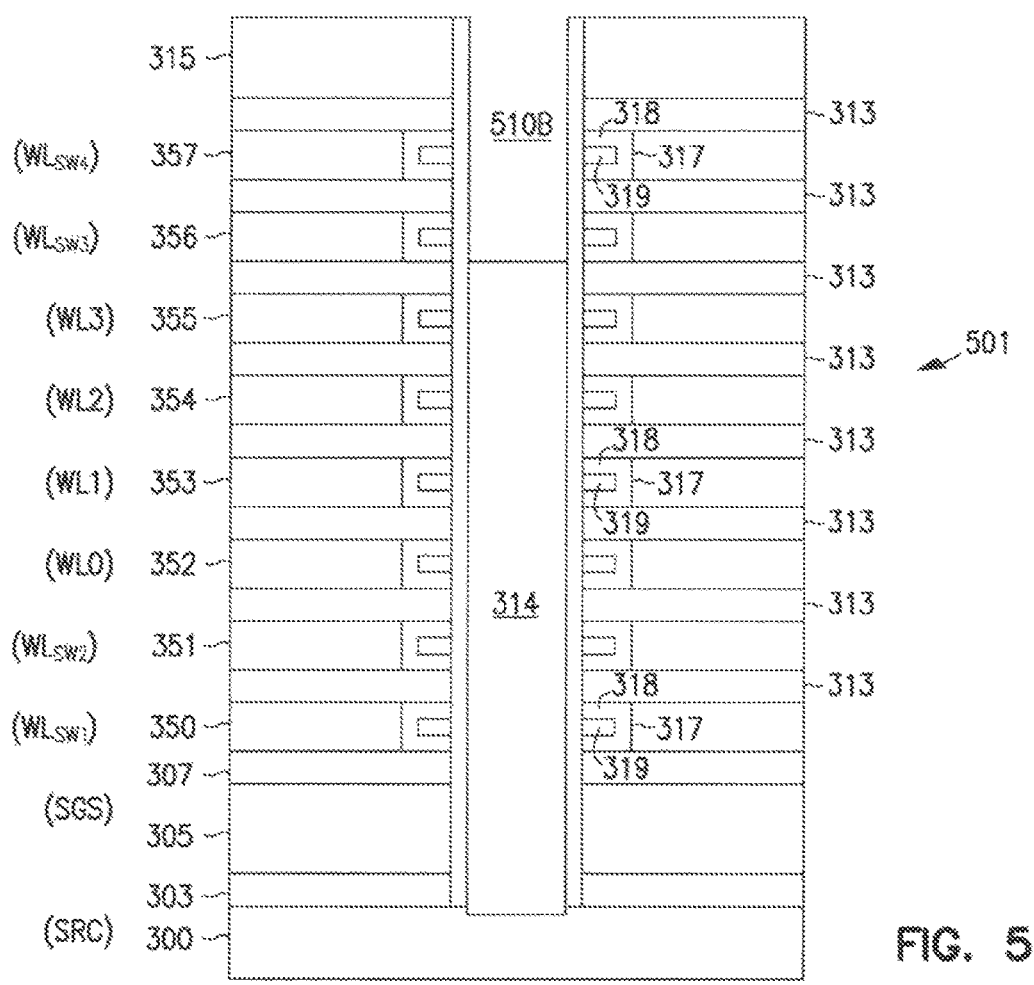

In FIG. 5B, a portion of material 314 can be removed (e.g., by etching) from a hole portion 510B of hole 510. As shown in FIG. 3B, hole portion 510B may include a recess (e.g., opening) extending from capping material 315 to conductor material 356. The depth of the recess can be dependent on subsequent processes that may include an etch process, a clean process, or both.

Figure 5C:
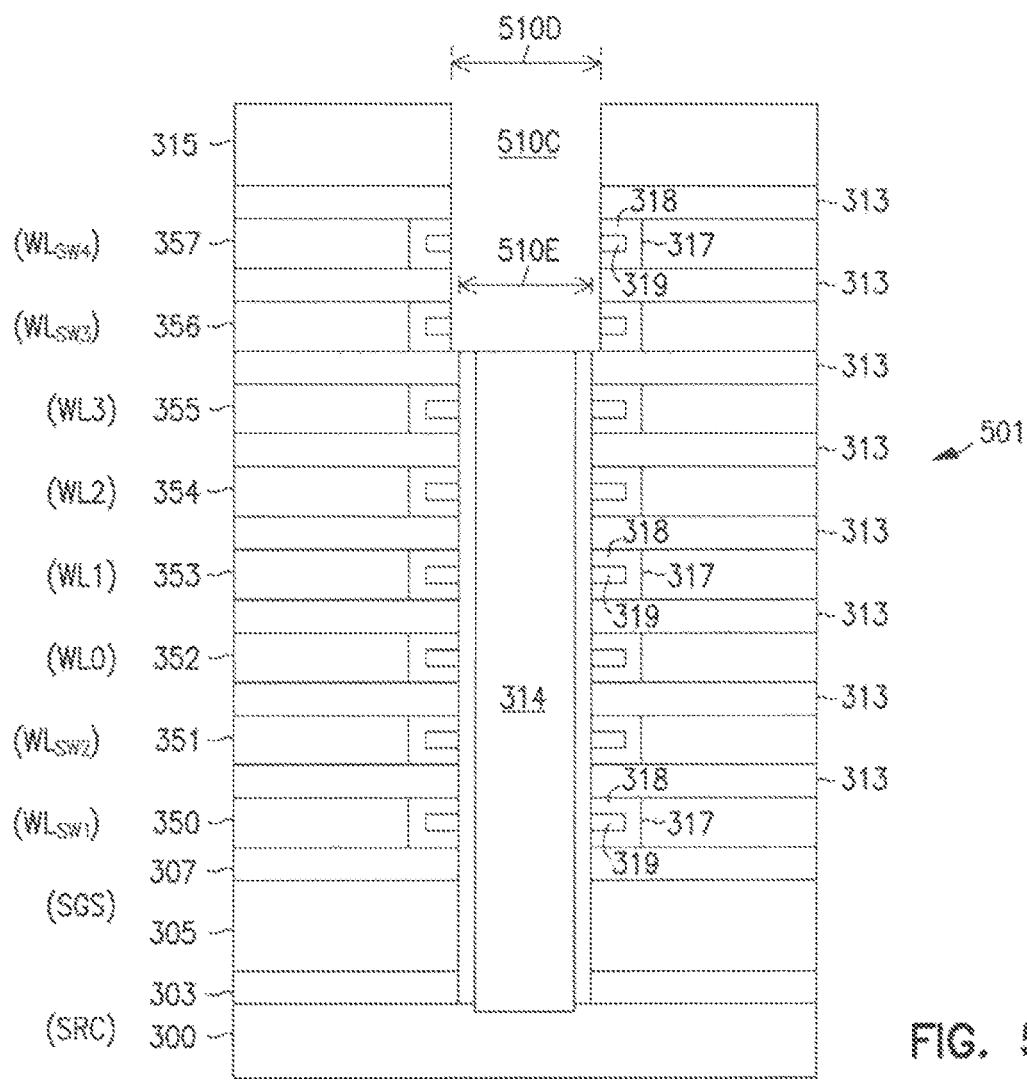

In FIG. 5C, the size of hole portion 510B (FIG. 5B) can be enlarged to form an enlarged hole portion 510C. Forming enlarged hole portion 510C can include removing tunneling material 312 from hole portion 510B. Enlarged hole portion 510C can have a diameter 510D that is greater than a diameter 510E (e.g., a diameter of an un-enlarged portion of hole 510). The value of diameter 510D can be selected based on an alignment margin for forming a conducting channel in an additional deck (e.g., similar to deck 302 in FIG. 3S) directly over enlarged hole portion 510C. In some processes, as an example, diameter 510D can be approximately 14 nanometers greater than diameter 510E.

Enlarged hole portion 510C may improve a process (e.g., allowing more alignment margin) for forming a channel (e.g., multi-deck channel) in an additional deck formed over deck 501.

Figure 5D:
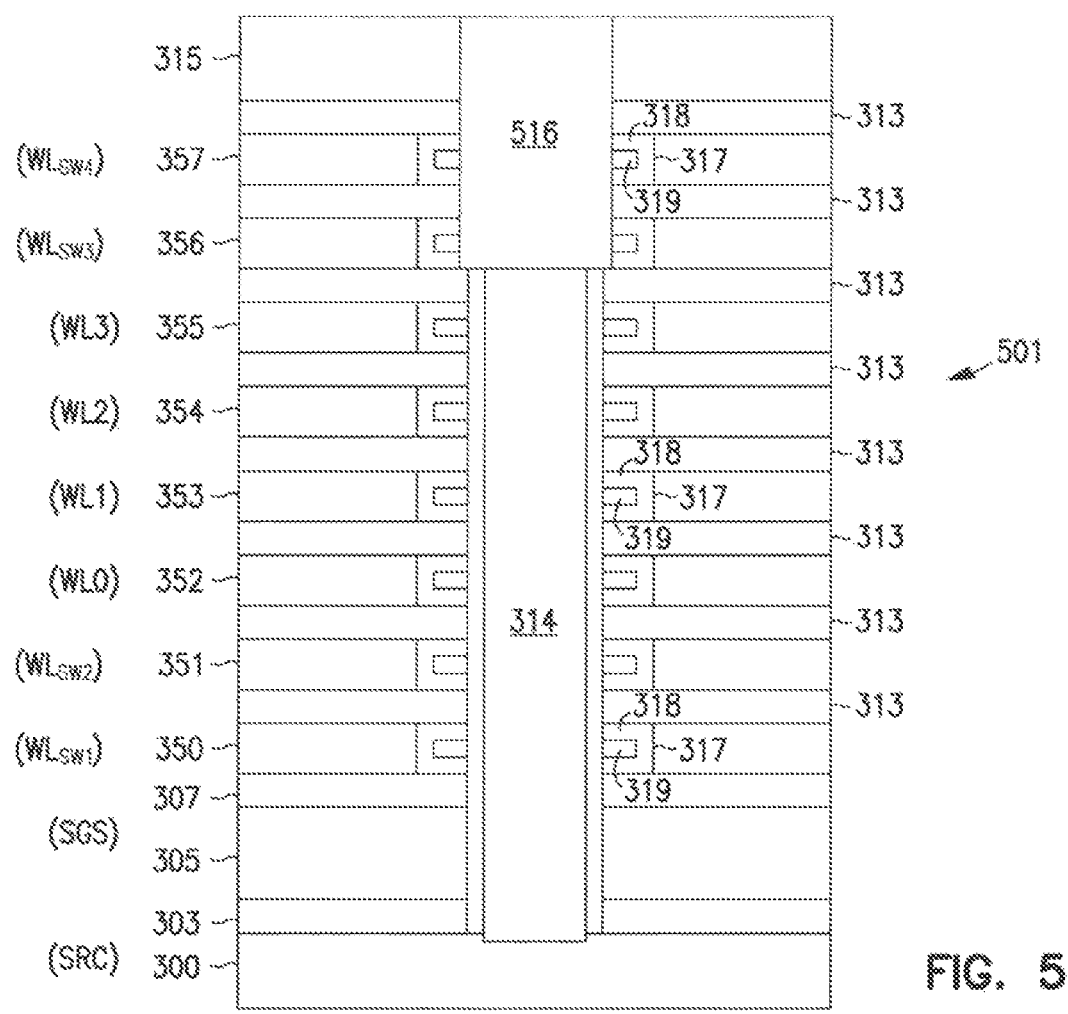

In FIG. 5D, a sacrificial material 516 is formed in enlarged hole portion 510C. After sacrificial material 516 is formed, a flattening process (CMP process) may be performed to flatten sacrificial material 516 such that its top surface may be co-planar with the top surface of capping material 315. In an alternative process, the flattening process (e.g., CMP process) may be skipped.

Sacrificial material 516 can include a material similar to, or identical to that of sacrificial material 316 (FIG. 3E).

Figure 5E:
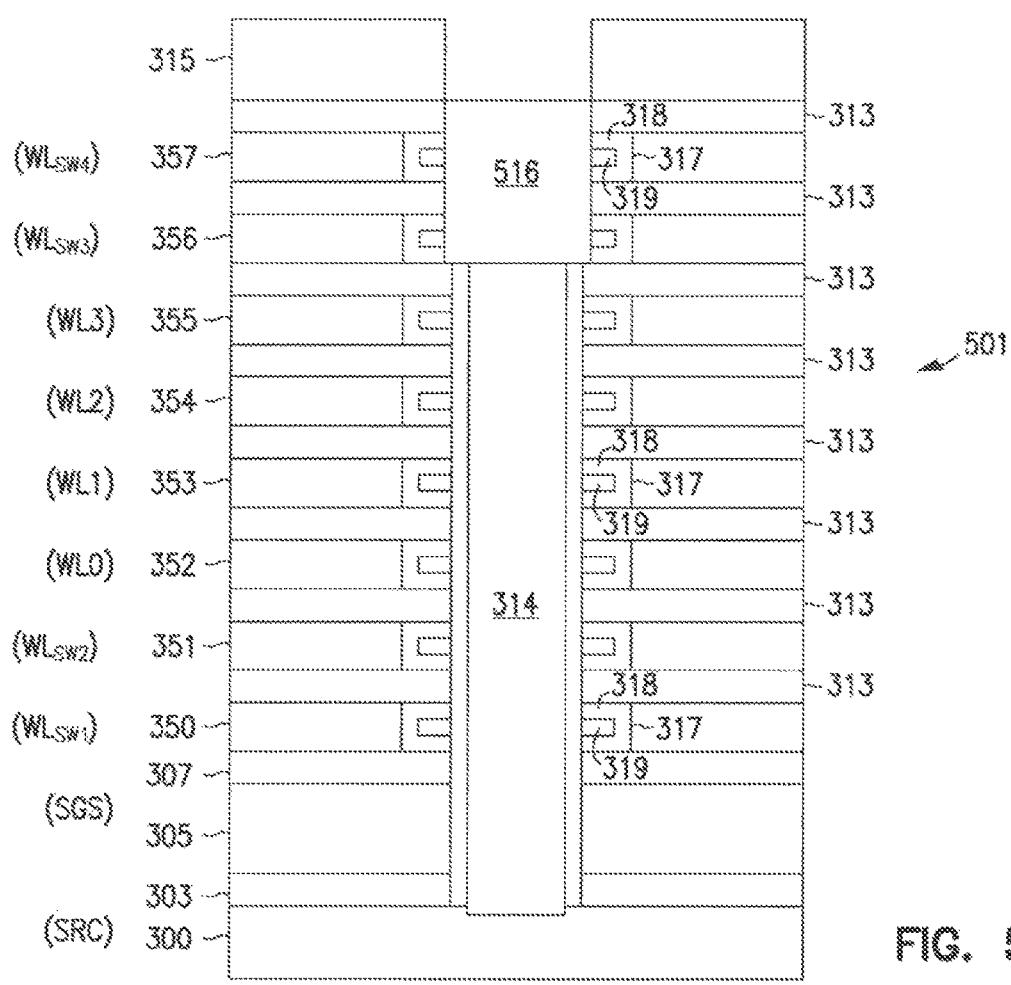

In FIG. 5E, a portion of sacrificial material 516 can be removed. For example, hydrofluoric acid (HF) can be used to remove a portion of sacrificial material 516 adjacent material 315.

Figure 5F:
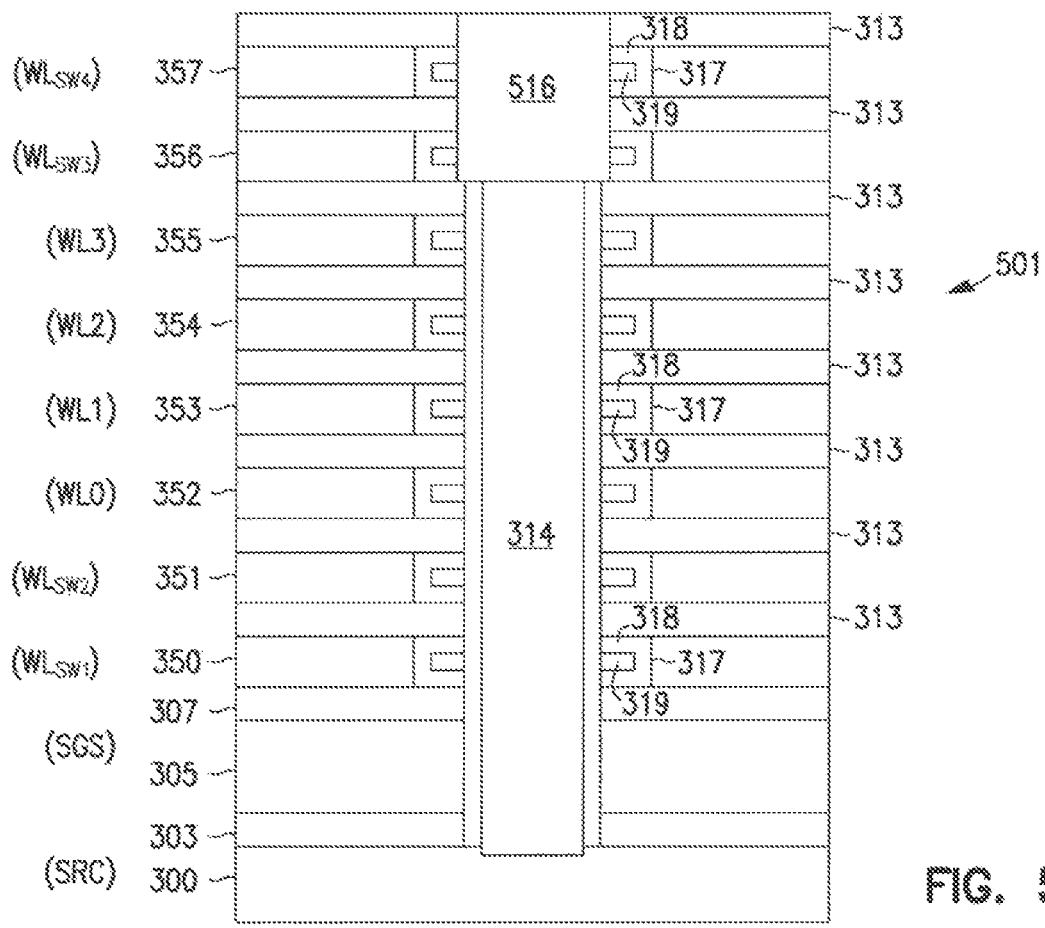

In FIG. 5F, capping material 315 can be removed (e.g., by selective dry etch, wet etch, or CMP). In an alternative process, the processes associated with FIG. 5E and FIG. 5F can be combined such that a portion of sacrificial material 516 (that was removed in FIG. 5E) and capping material 315 (FIG. 5E) can be removed in a single step (e.g., using TMAH). In FIG. 5F, after capping material 315 is removed, a flattening process (e.g., CMP) may be performed to improve the planarity of deck 501 before an additional deck is formed over deck 501.

Further processes similar to, or identical to, that described above with reference to FIG. 3H through FIG. 3S can be used to form multiple decks of memory cells including a multi-deck channel associated with the memory cells.

FIG. 6A through FIG. 6G show different portions of fabrication processes of forming a memory device, according to an embodiment of the invention. Some of the processes described below with reference to 6A through FIG. 6G can be similar to, or identical to, the processes described above with reference to FIG. 3A through FIG. 3S. Thus, similar or identical features or materials between FIG. 3A through FIGS. 3S and 6A through FIG. 6G are not repeated in the description associated with FIG. 6A through FIG. 6G.

The processes described below with reference to FIG. 6A through FIG. 6G may provide an alignment margin that is greater than other alignment margins described above with reference to FIG. 3A through FIG. 5F.

Figure 6A:
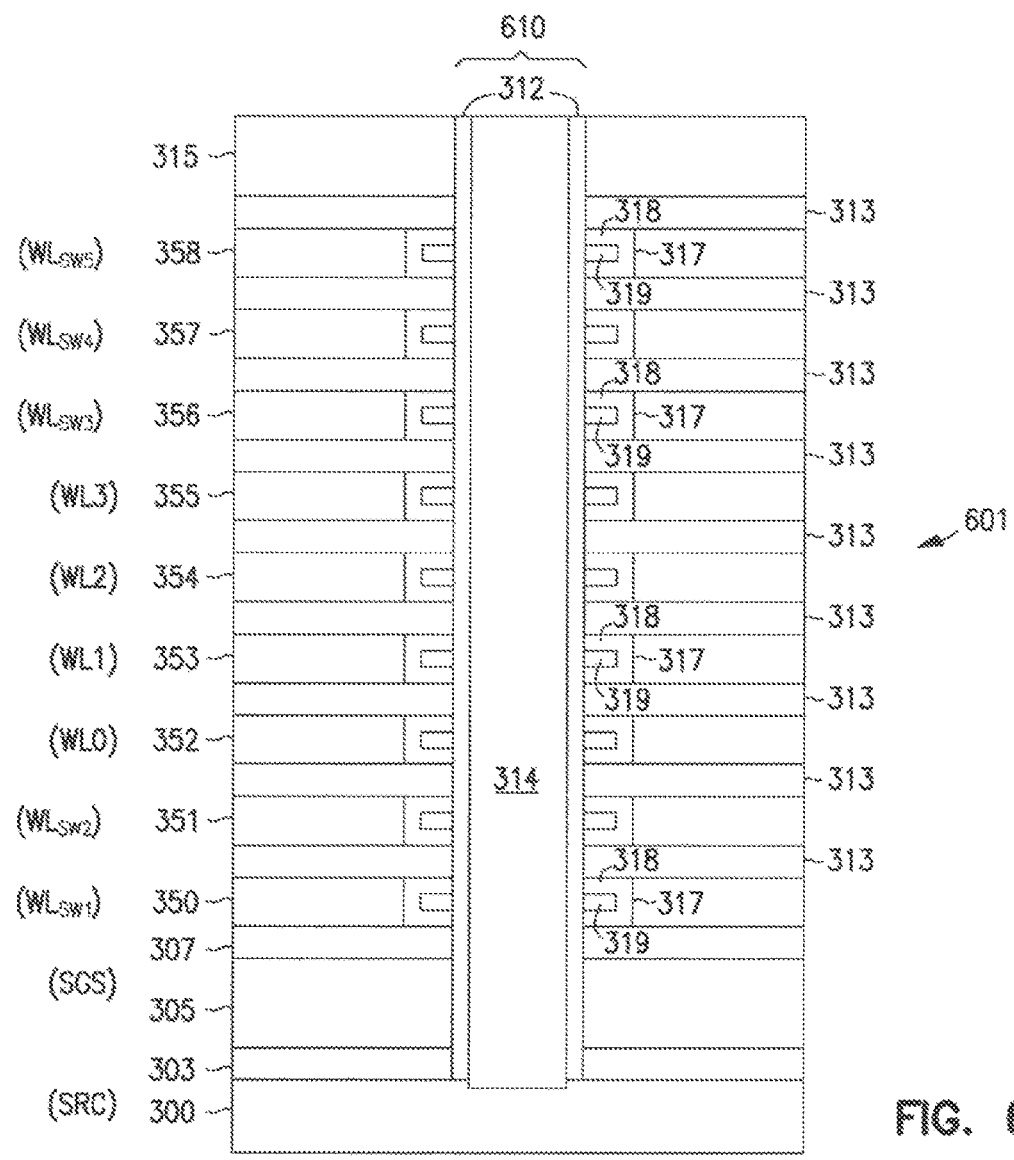
FIG. 6A through FIG. 6G show different portions of a further fabrication processes of forming a memory device, according to an embodiment of the invention.

In FIG. 6A, deck 601 can include structures and materials similar to, or identical to, that of deck 301 of FIG. 3A. In FIG. 6A, each of the levels where conductor materials 350 through 358 are located can include a memory cell structure.

As shown in FIG. 6A, deck 601 can include a hole 610 extending through materials that include conductor materials 350 through 358, dielectric materials 313, and capping material 315. Hole 510 can contain tunneling material 312 on its sidewalls and material 314 adjacent tunneling material 312.

Figure 6B:
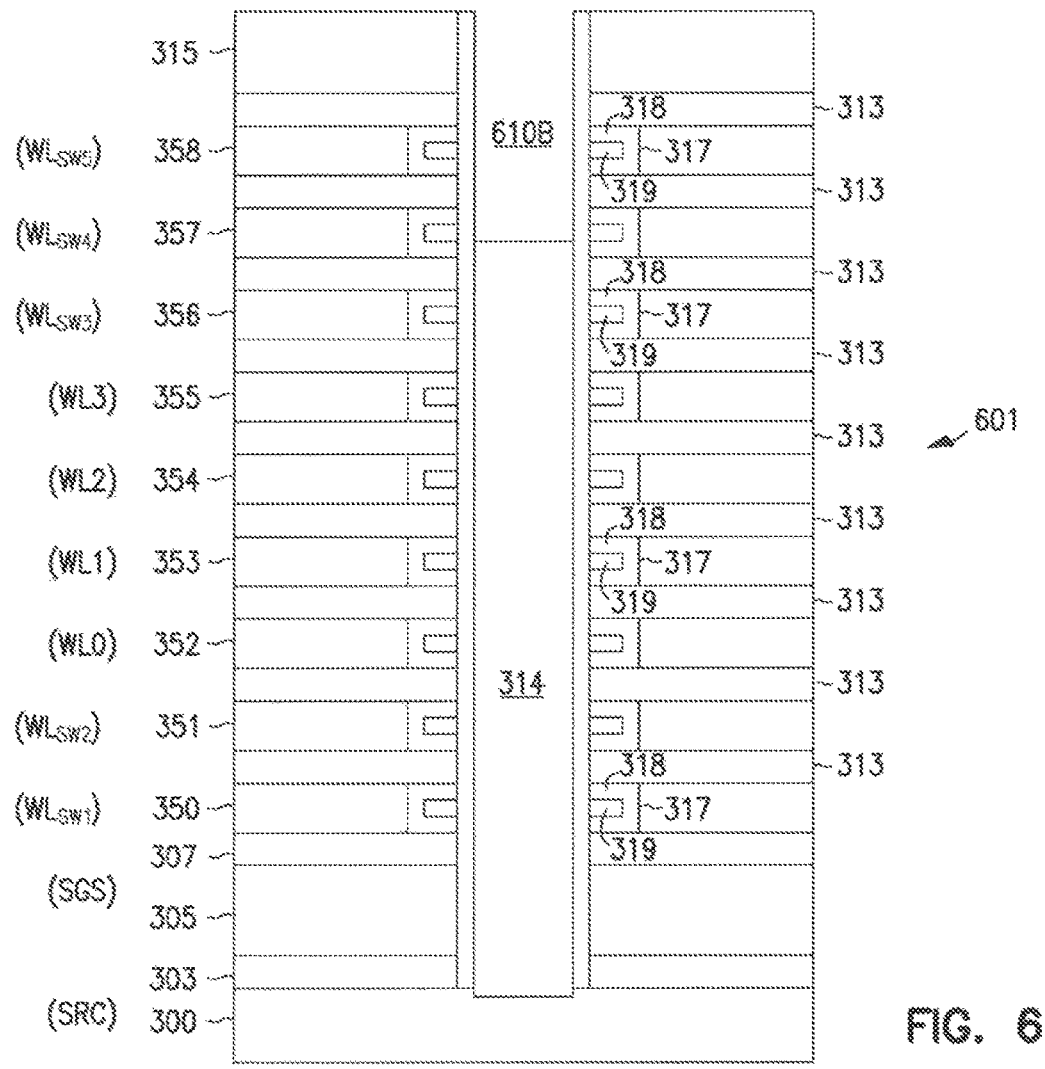

In FIG. 6B, a portion of material 314 can be removed (e.g., by etching) from a hole portion 610B of hole 610. As shown in FIG. 6B, hole portion 610B may include a recess (e.g., opening) extending from capping material 315 to conductor material 357. The depth of the recess can be dependent on subsequent processes that may include an etch process, a clean process, or both.

Figure 6C:
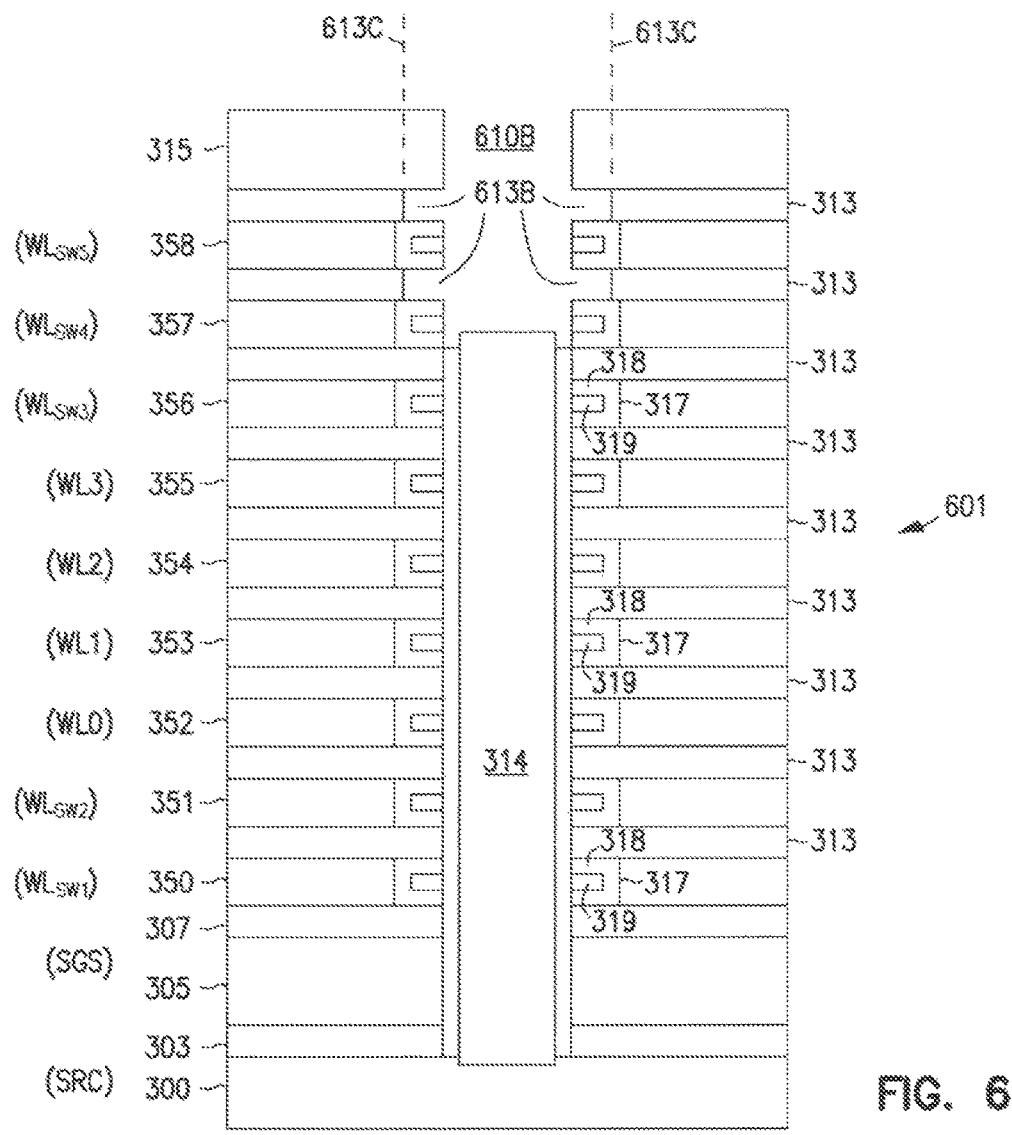

In FIG. 6C, portions of dielectric materials 313 adjacent hole portion 610B can be removed (e.g., by wet etching), such that recesses 613B are formed. Each of recesses 613B can include a vertical sidewall formed by edge 613C of dielectric materials 313. As shown in FIG. 6C, edge 613C can extend laterally from hole portion 610B to a location beyond the interface (e.g., vertical interface) between IDP material 318 and charge-storage material 319. The lateral dimension between edge 613C may create sufficient CD of a sacrificial material to be formed in hole portion 610B, as described below.

Figure 6D:
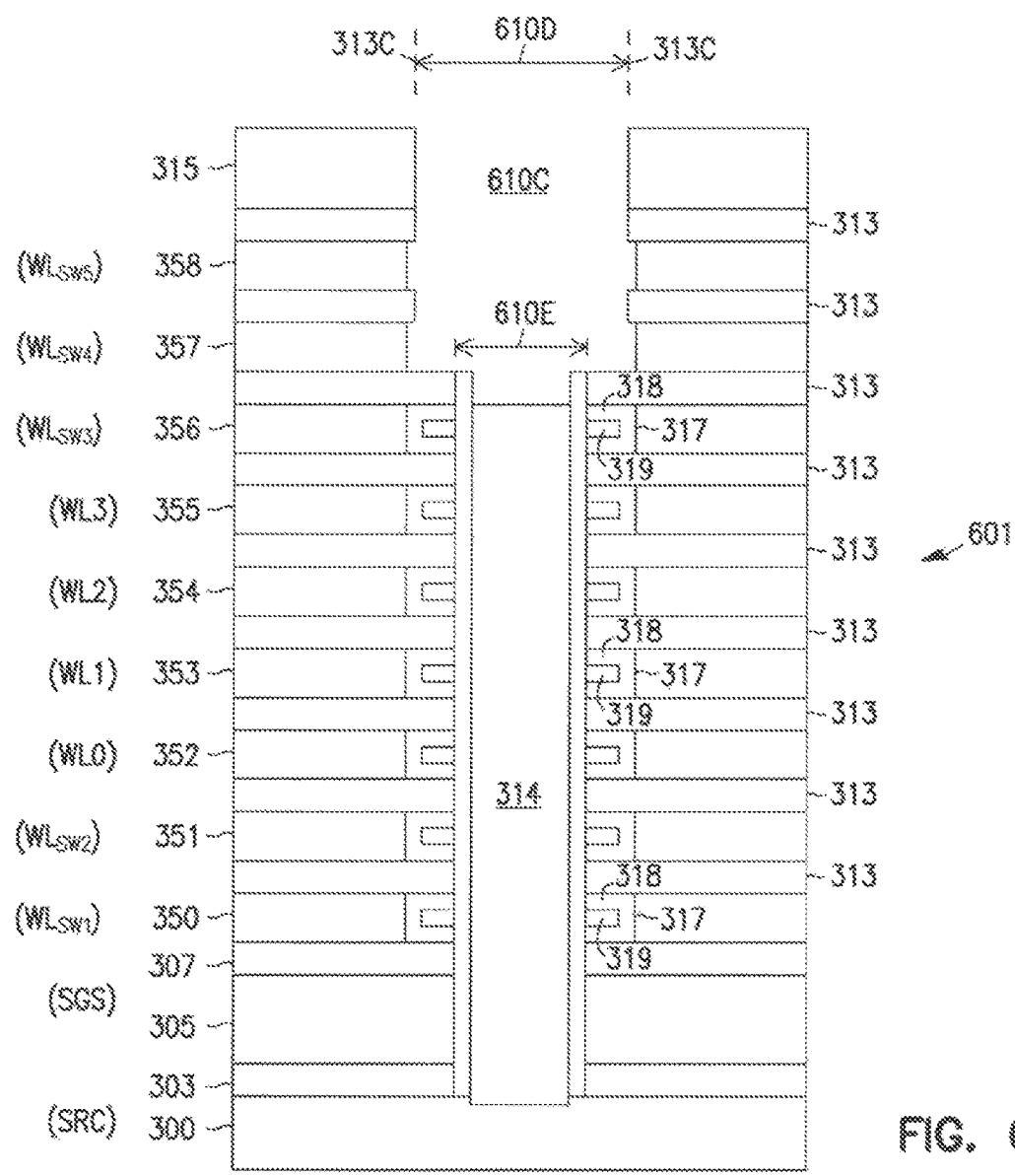

In FIG. 6D, the size of hole portion 610B in FIG. 6C can be enlarged to form an enlarged hole portion 610C. Forming enlarged hole portion 610C can include selectively removing a portion of capping material 315 at locations adjacent hole portion 310B, IDP material 318, and charge-storage material 319 at locations adjacent hole portion 610B (FIG. 6C). A dry etch (e.g., isotropic dry etch) and wet etch may be used to form enlarged hole portion 610C. Enlarged hole portion 610C can have a diameter 610D that is greater than a diameter 610E (e.g., a diameter of an un-enlarged portion of hole 610). The value of diameter 610D can be selected based on a value of an alignment margin for forming a channel (in an additional deck) directly over enlarged hole portion 610C. In some processes, as an example, diameter 610D can be approximately 50 nanometers greater than diameter 610E.

Enlarged hole portion 610C may improve a process (e.g., allowing more alignment margin) for forming a channel (e.g., multi-deck channel) in an additional deck formed over deck 601.

Figure 6E:
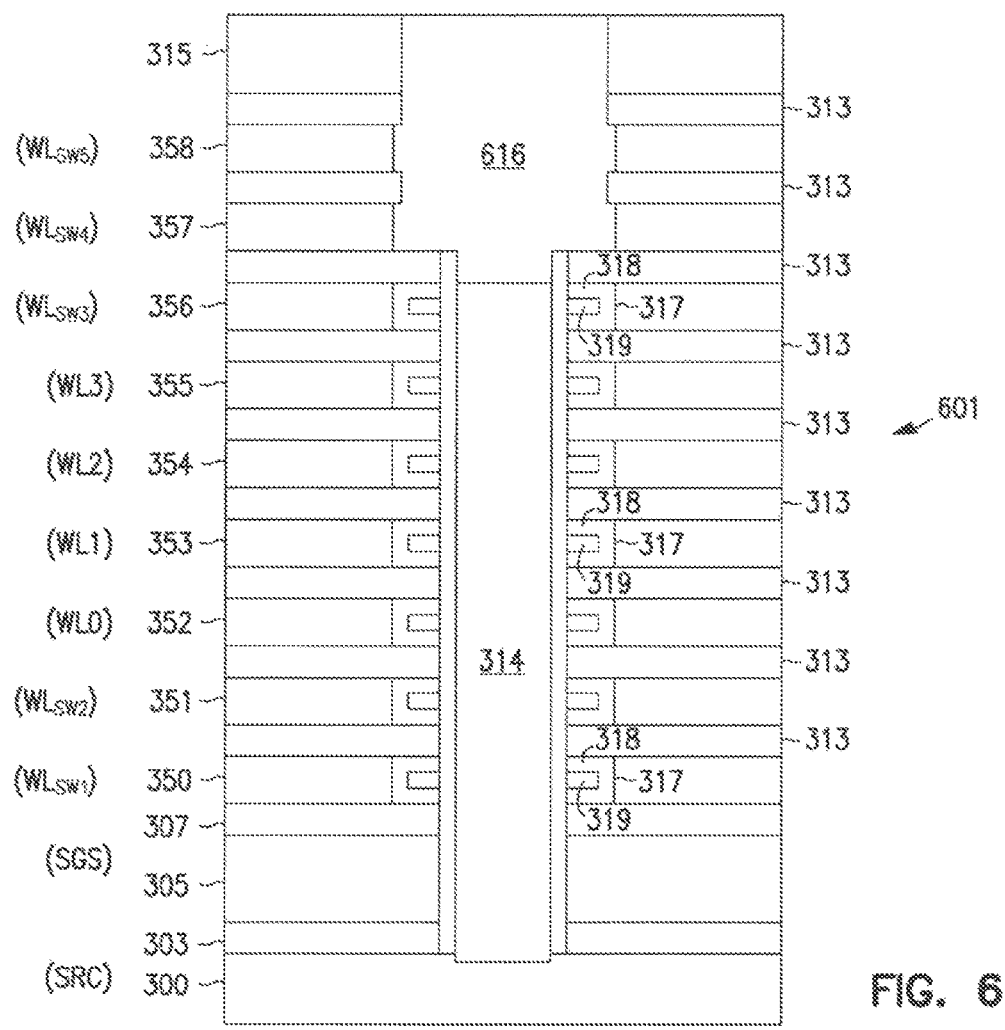

In FIG. 6E, a sacrificial material 616 is formed in enlarged hole portion 610C. After sacrificial material 616 is formed, a flattening process (CMP process) may be performed to flatten sacrificial material 616 such that its top surface may be co-planar with the top surface of capping material 315. In an alternative process, the flattening process (e.g., CMP process) may be skipped.

Sacrificial material 616 can include a material similar to, or identical to that of sacrificial material 316 (FIG. 3E).

Figure 6F:
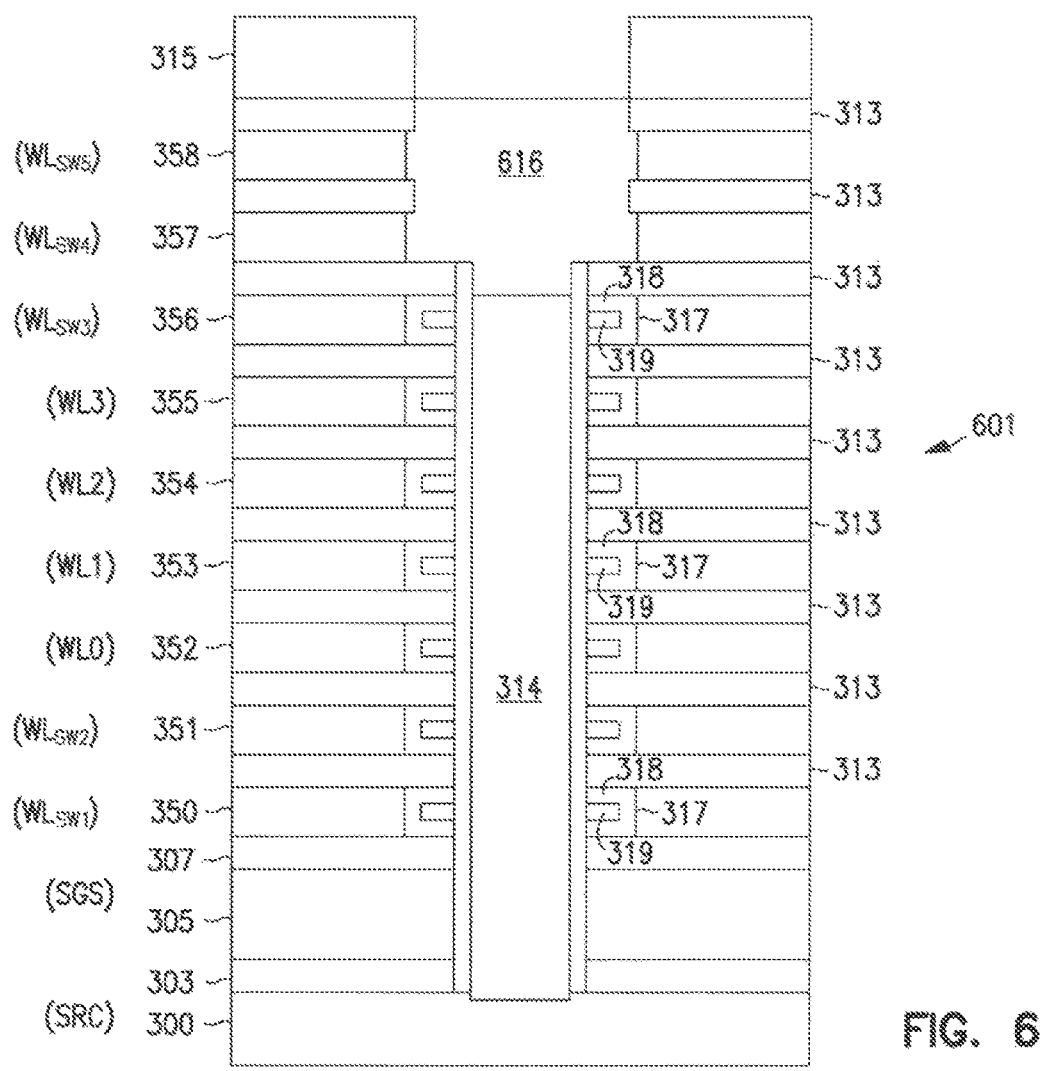

In FIG. 6F, a portion of sacrificial material 616 can be removed. For example, hydrofluoric acid (HF) can be used to remove a portion of sacrificial material 616 adjacent material 315.

Figure 6G:
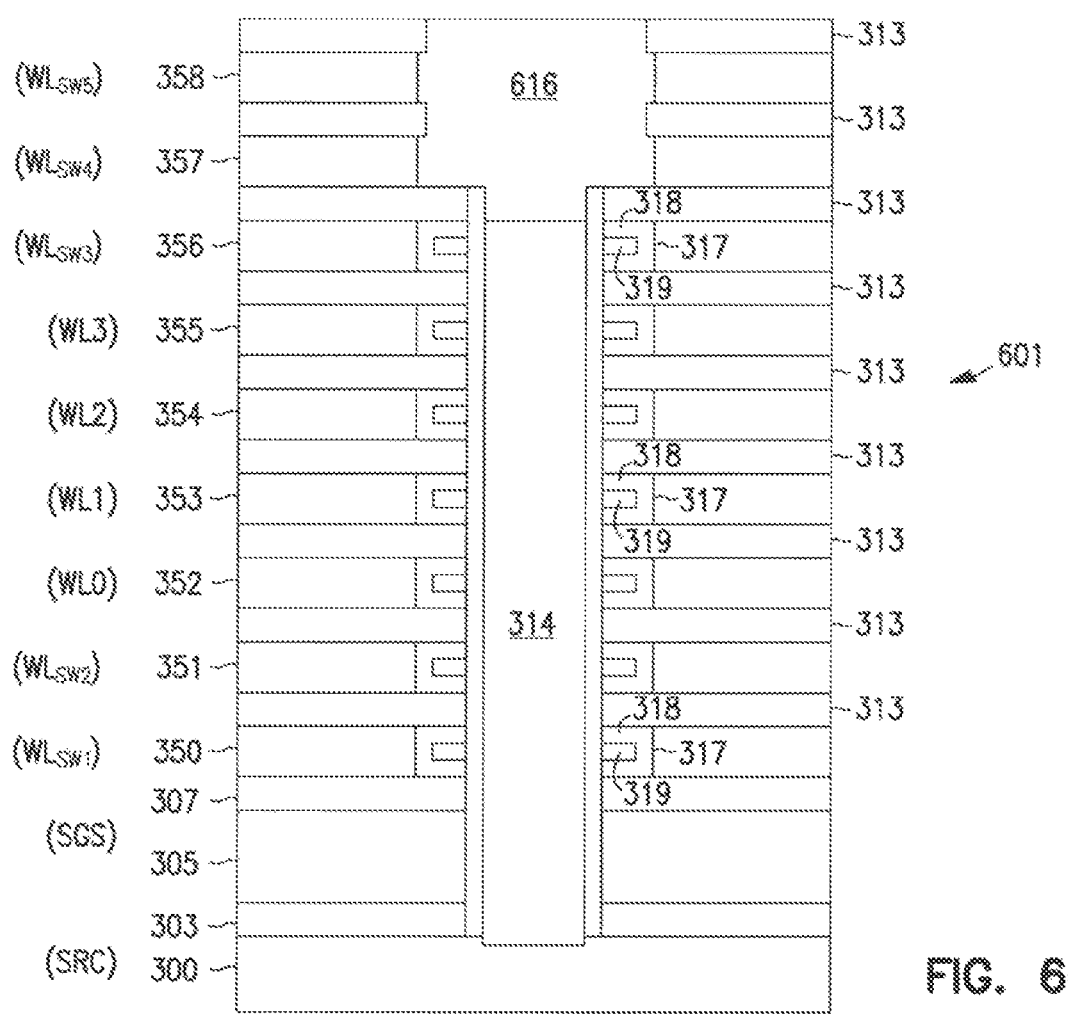

In FIG. 6G, capping material 315 can be removed (e.g., by selective dry etch, wet etch, or CMP). In an alternative process, the processes associated with FIG. 6F and FIG. 6G can be combined such that a portion of sacrificial material 616 (that was removed in FIG. 6F) and capping material 315 (FIG. 6F) can be removed in a single step (e.g., using TMAH). In FIG. 6G, after capping material 315 is removed, a flattening process (e.g., CMP) may be performed to improve the planarity of deck 601 before an additional deck is formed over deck 601.

Further processes similar to, or identical to, that described above with reference to FIG. 3H through FIG. 3S can be used to form multiple decks of memory cells including a multi-deck channel associated with the memory cells.

The illustrations of the apparatuses (e.g., memory devices 100 and 200) and methods (e.g., processes described above with reference to FIG. 3A through FIG. 6G and operations of memory devices 100 and 200) are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 6G include apparatuses and methods having multiple decks of memory cells and associated control gates. A method includes forming a first deck having alternating conductor materials and dielectric materials and a hole containing materials extending through the conductor materials and the dielectric materials. The methods can also include forming a sacrificial material in an enlarged portion of the hole, and forming a second deck of memory cells over the first deck. Other embodiments, including additional apparatuses and methods, are described.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. A method comprising:
   forming a first deck having alternating first conductor materials and first dielectric materials and a hole containing materials extending through the first conductor materials and the first dielectric materials;
   removing a portion of at least one of the materials from a portion of the hole;
   enlarging the portion of the hole to form an enlarged portion of the hole;
   forming a sacrificial material in the enlarged portion of the hole; and
   forming a second deck having alternating second conductor materials and second dielectric materials over the first deck.

2. The method of claim 1, further comprising:
   forming a second hole through the second conductor materials and the second dielectric materials, such that at least a portion of the sacrificial material is exposed through the second hole;
   removing the sacrificial material; and
   forming a third hole through the first and second decks, such that the third hole includes a combination of the second hole and the hole, including the enlarged hole portion of the hole.

3. The method of claim 2, further comprising:
   forming a tunneling material on sidewalls of the third hole; and
   forming a channel material adjacent the tunneling material.

4. The method of claim 3, further comprising:
   forming a third dielectric material in the hole, the third dielectric material being surrounded by at least the channel material.

5. The method of claim 1, further comprising:
   forming a second hole through the second conductor materials and second dielectric materials, such that at least a portion of the sacrificial material is exposed at the second hole;
   removing the sacrificial material;
   forming a tunneling material on sidewalls of the second hole; and
   forming a channel material adjacent the tunneling material and contacting an additional channel material in the hole.

6. The method of claim 5, further comprising:
   forming a third dielectric material in the hole, the third dielectric material being surrounded by at least the channel material adjacent the tunneling material.

7. The method of claim 1, wherein the sacrificial material includes aluminum.

8. A method comprising:
   forming a first deck having alternating first conductor materials and first dielectric materials and a first hole containing materials extending through the first conductor materials and the first dielectric materials, the materials in the first hole include a tunneling material on sidewalls of the first hole and an additional material adjacent the tunneling material;

removing a portion of the additional material from a portion of the first hole;

enlarging the portion of the first hole to form an enlarged portion of the first hole;

forming a sacrificial material in the enlarged portion of the first hole;

forming alternating levels of second conductor materials and second dielectric materials over the first deck;

forming a second hole to expose at least a portion of the sacrificial material in the first hole;

recessing the second conductor materials adjacent the second hole to form recesses;

forming a dielectric material on sidewalls of the second hole and on sidewalls of the recesses;

forming charge-storage material in the recesses and adjacent the dielectric material;

removing the sacrificial material;

forming an additional tunneling material in the second hole, such that the additional tunneling material contacts the tunneling material in the first hole;

removing a remaining portion of the additional material adjacent the tunneling material in first hole; and forming a channel material on sidewalls of the first and second holes.

9. The method of claim 8, wherein the tunneling material contained in the first hole includes an oxide of silicon, and the additional material contained in the first hole includes polysilicon.

10. The method of claim 8, wherein the sacrificial material includes aluminum oxide.

* * * * *